US012696564B2

(12) United States Patent
Mao et al.

(10) Patent No.: US 12,696,564 B2
(45) Date of Patent: Jul. 28, 2026

(54) LIGHT-SENSING DEVICE

(71) Applicant: AUO Corporation, Hsinchu (TW)

(72) Inventors: Yu-Nung Mao, Hsinchu (TW);
Chao-Chien Chiu, Hsinchu (TW)

(73) Assignee: AUO Corporation, Hsinchu (TW)

( * ) Notice: Subject to any disclaimer, the term of this patent is extended or adjusted under 35 U.S.C. 154(b) by 485 days.

(21) Appl. No.: 18/296,988

(22) Filed: Apr. 6, 2023

(65) Prior Publication Data

US 2023/0352504 A1      Nov. 2, 2023

Related U.S. Application Data

(60) Provisional application No. 63/335,894, filed on Apr. 28, 2022.

(30) Foreign Application Priority Data

Sep. 5, 2022     (TW) .................................. 111133536

(51) Int. Cl.
*H10F 39/00*         (2025.01)
*G06V 40/13*         (2022.01)

(52) U.S. Cl.
CPC ..... *H10F 39/8057* (2025.01); *G06V 40/1318* (2022.01)

(58) Field of Classification Search
CPC .... H10F 39/8057; H10F 39/12; H10F 39/803; H10F 39/811; G06V 40/1318
See application file for complete search history.

(56) References Cited

U.S. PATENT DOCUMENTS 11,915,510 B2      2/2024   Ku et al.
2007/0281430 A1*  12/2007  Hirabayashi ......... H10D 86/441
                                                257/E27.113
2013/0093720 A1    4/2013   Liu et al.
2020/0064968 A1*   2/2020   Kim ...................... G06F 3/0443
2022/0082663 A1    3/2022   Chou et al.
2022/0190038 A1*   6/2022   Tada ....................... H10F 39/12

FOREIGN PATENT DOCUMENTS

CN        110705506      1/2020
KR        20220017015    2/2022
TW        I705381        9/2020

* cited by examiner

*Primary Examiner* — Yasser A Abdelaziez
(74) *Attorney, Agent, or Firm* — JCIPRNET

(57) ABSTRACT

A light-sensing device comprises a substrate, multiple first working light-sensing elements, multiple second working light-sensing elements, multiple third working light-sensing elements, multiple first reference light-sensing elements, multiple second reference light-sensing elements, multiple third reference light-sensing elements, a first processing element, and a second processing element. The substrate has a first working area, a second working area, a third working area, a first reference area, a second reference area, and a third reference area. The multiple first working light-sensing elements, the multiple second working light-sensing elements, and the multiple third working light-sensing elements are respectively disposed in the first working area, the second working area, and the third working area. The multiple first reference light-sensing elements, the multiple second reference light-sensing elements, and the multiple third reference light-sensing elements are respectively disposed in the first reference area, the second reference area, and the third reference area.

10 Claims, 23 Drawing Sheets

10B 240
230
220
210W(210)
200
190
180
170
160
150
140
GI
130
110

WSE
(SE)
T
D
180
210W(210)
WSM

T
Ta
Tb
Tc
Td

D
160
170
190

210W(210)

212

182

L

L

154

Tb

GIb

Tc

Ta

152

GIa

Td

WSM

BLU

112

10 z

RSM { 120
      140

D { 160
    170
    190

T { Tc
    Td

140

210R(210)

140e 122,122e

120

250

Td  Tc

Td

190

160

250

250

170

182
252
250

RSE(10B)

LIGHT-SENSING DEVICE

CROSS-REFERENCE TO RELATED APPLICATION

The application claims the priority benefits of U.S. provisional application Ser. No. 63/335,894, filed on Apr. 28, 2022, and Taiwan application serial no. 111133536, filed on Sep. 5, 2022. The entirety of each of the above-mentioned patent applications is hereby incorporated by reference herein and made a part of the specification.

BACKGROUND

Technical Field

The disclosure relates to a light-sensing device.

Description of Related Art

In the known technical field, the fingerprint sensing device may sense the image of the fingerprint to be detected according to the sensing light through the sensing element, and perform identification according to the fingerprint image. In the conventional technical field, after the fingerprint sensing device is used for a long time, the gray level of the sensed fingerprint image will decrease due to the sensing element being under the influence of the sensing light for a long time. In the way, when identifying the fingerprint image, an identification error may occur due to the insufficient gray level.

SUMMARY

The disclosure provides a light-sensing device with favorable performance.

The disclosure provides another light-sensing device with the same favorable performance.

A light-sensing device according to an embodiment of the disclosure includes a substrate, multiple first working light-sensing elements, multiple second working light-sensing elements, multiple third working light-sensing elements, multiple first reference light-sensing elements, and multiple second reference light-sensing elements, multiple third reference light-sensing elements, a first processing element, a second processing element, and a third processing element. The substrate has a first working area, a second working area, a third working area, a first reference area, a second reference area, and a third reference area. The first working area, the second working area, and the third working area are arranged sequentially in the first direction, and the first reference area, the second reference area, and the third reference area are respectively disposed corresponding to the first working area, the second working area, and the third working area. The multiple first working light-sensing elements, the multiple second working light-sensing elements, and the multiple third working light-sensing elements are respectively disposed in the first working area, the second working area, and the third working area. Each of the multiple first working light-sensing elements, the multiple second working light-sensing elements, and the multiple third working light-sensing elements includes a light-sensing pattern and a first light-blocking structure disposed on the light-sensing pattern. The first light-blocking structure of each of the multiple first working light-sensing elements, the multiple second working light-sensing elements, and the multiple third working light-sensing elements has a light-transmitting opening overlapping the light-sensing pattern. The multiple first reference light-sensing elements, the multiple second reference light-sensing elements, and the multiple third reference light-sensing elements are respectively disposed in the first reference area, the second reference area, and the third reference area. Each of the multiple first reference light-sensing elements, the multiple second reference light-sensing elements, and the multiple third reference light-sensing elements includes the light-sensing pattern and the first light-blocking structure disposed on the light-sensing pattern. The first light-blocking structure of each of the multiple first reference light-sensing elements, the multiple second reference light-sensing elements, and the multiple third reference light-sensing elements shields the light-sensing pattern. The multiple first working light-sensing elements are electrically connected to the first processing element. The multiple second working light-sensing elements are electrically connected to the second processing element. The multiple third working light-sensing elements are electrically connected to the third processing element. The multiple first reference light-sensing elements, the multiple second reference light-sensing elements, and the multiple third reference light-sensing elements are respectively electrically connected to the first processing element, the second processing element, and the third processing element.

A light-sensing device according to another embodiment of the disclosure includes a substrate, multiple first working light-sensing elements, multiple second working light-sensing elements, multiple third working light-sensing elements, multiple first reference light-sensing elements, multiple second reference light-sensing elements, multiple third reference light-sensing elements, a first processing element, a second processing element, at least one first conductive line, at least one first connecting line, at least one second conductive line, at least one second connecting line, at least one third conductive line, and at least one third connecting line. The substrate has a first working area, a second working area, a third working area, a first reference area, a second reference area, and a third reference area. The first working area, the second working area, and the third working area are arranged sequentially in the first direction, and the first reference area, the second reference area, and the third reference area are respectively disposed corresponding to the first working area, the second working area, and the third working area. The second reference area includes a first sub-area, and the first working area is located between the first sub-area of the second reference area and the second working area. The multiple first working light-sensing elements, the multiple second working light-sensing elements, and the multiple third working light-sensing elements are respectively disposed in the first working area, the second working area, and the third working area. Each of the multiple first working light-sensing elements, the multiple second working light-sensing elements, and the multiple third working light-sensing elements includes a light-sensing pattern and a first light-blocking structure disposed on the light-sensing pattern. The first light-blocking structure of each of the multiple first working light-sensing elements, the multiple second working light-sensing elements, and the multiple third working light-sensing elements has a light-transmitting opening overlapping the light-sensing pattern. The multiple first reference light-sensing elements, the multiple second reference light-sensing elements, and the multiple third reference light-sensing elements are respectively disposed in the first reference area, the second reference area, and the third reference area. Each of the multiple first reference light-sensing elements, the multiple second reference light-sensing elements, and the multiple third reference light-sensing elements includes the light-sensing pattern and the first light-blocking structure disposed on the light-sensing pattern. The first light-blocking structure of each of the multiple first reference light-sensing elements, the multiple second reference light-sensing elements, and the multiple third reference light-sensing elements shields the light-sensing pattern, and a first portion of the multiple second reference light-sensing elements is disposed in the first sub-area of the second reference light-sensing element. The multiple first working light-sensing elements are electrically connected to the first processing element. The multiple third working light-sensing elements are electrically connected to the second processing element. A first portion of the multiple second working light-sensing elements is electrically connected to the first processing element. A second portion of the multiple second working light-sensing elements is electrically connected to the second processing element. The at least one first conductive line is electrically connected to the multiple first working light-sensing elements and the first processing element. The at least one first connecting line is electrically connected to at least a part of the multiple first reference light-sensing elements and the first processing element. A first portion of the at least one second conductive line is electrically connected to the first portion of the multiple second working light-sensing elements and the first processing element. A first portion of the at least one second connecting line is electrically connected to the first portion of the multiple second reference light-sensing elements and the first processing element. The at least one third conductive line is electrically connected to the multiple third working light-sensing elements and the second processing element. The at least one third connecting line is electrically connected to at least a part of the multiple third reference light-sensing elements and the second processing element. The first portion of the at least one second connecting line has at least one connection terminal connected to the first processing element. The multiple first conductive lines have multiple connection terminals connected to the first processing element. The first portion of the multiple second conductive lines has at least one connection terminal connected to the first processing element. The at least one connection terminal of the first portion of the at least one second connecting line is disposed between the multiple connection terminals of the multiple first conductive lines and the at least one connection terminal of the first portion of the multiple second conductive lines.

DESCRIPTION OF THE EMBODIMENTS

Figure 1:
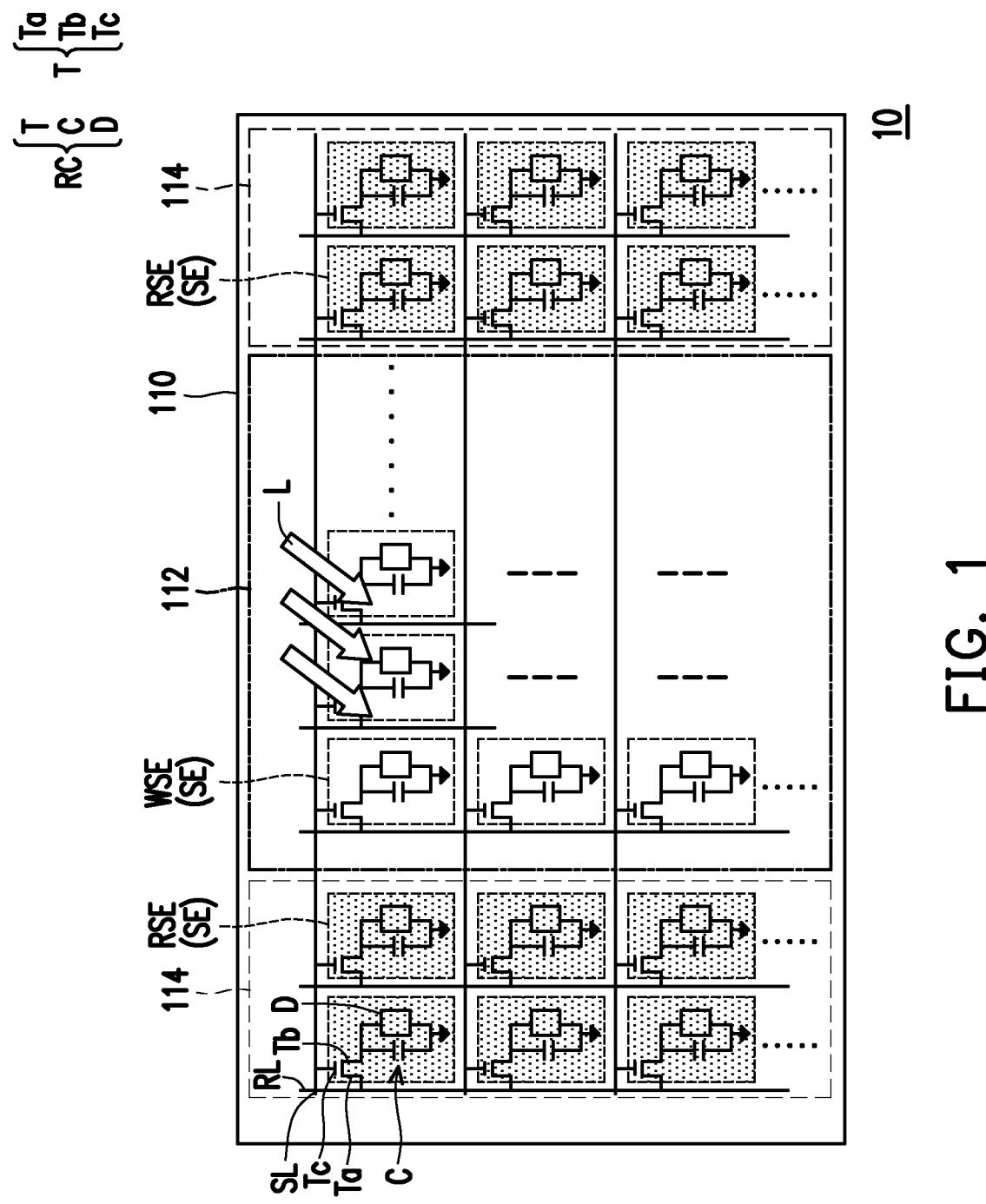
FIG. 1 is a schematic diagram of a light-sensing device according to an embodiment of the disclosure.

Reference will now be made in detail to the exemplary embodiments of the disclosure, and examples of the exemplary embodiments are illustrated in the accompanying drawings. Wherever possible, the same reference numerals are used in the drawings and descriptions to refer to the same or similar parts.

It will be understood that when a component such as a layer, a film, a region, or a substrate is referred to be "on" or "connected to" another component, it may be directly on or connected to the another component, or intermediate components may also exist there between. Comparatively, when a component is referred to be "directly on" or "directly connected" to another component, none other intermediate component exits there between. As used herein, the "connection" may refer to physical and/or electrical connection. Furthermore, "electrical connection" or "coupling" of two components may refer to that other components may exist between the two components.

Considering the discussed measurement and a specific number of errors associated with the measurement (i.e., limitations of the measurement system), the terms "about", "approximate", or "substantial" used herein include the related value and an average within an acceptable deviation range for a specific value determined by those skilled in the art. For example, "about" may represent a range within one or a plurality of standard deviations of the related value, or within ±30%, ±20%, ±10%, ±5%. Moreover, the "about", "approximate", or "substantial" used herein may be a more acceptable deviation range or standard deviation based on optical properties, etching properties, or other properties, and not one standard deviation may be applied to all properties.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
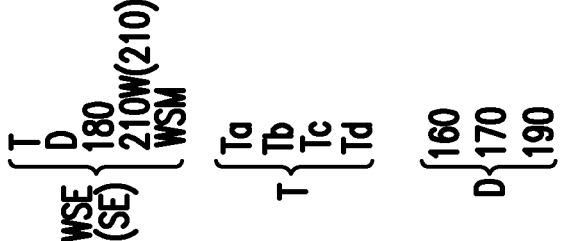
FIG. 2A is a schematic cross-sectional view of a light-sensing device according to an embodiment of the disclosure.
Figure 3:
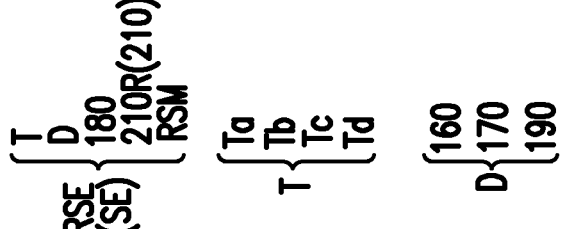
FIG. 3 is a schematic cross-sectional view of a light-sensing device according to an embodiment of the disclosure.

FIG. 1 is a schematic diagram of a light-sensing device according to an embodiment of the disclosure. FIG. 2A is a schematic cross-sectional view of a light-sensing device according to an embodiment of the disclosure. In particular, FIG. 2A shows a working light-sensing element WSE of a light-sensing device 10. FIG. 3 is a schematic cross-sectional view of a light-sensing device according to an embodiment of the disclosure. In particular, FIG. 3 shows a reference light-sensing element RSE of the light-sensing device 10.

Referring to FIG. 1, FIG. 2A, and FIG. 3, the light-sensing device 10 includes a substrate 110. In the embodiment, the substrate 110 may be glass, quartz, organic polymer, or other applicable materials. The substrate 110 has a working area 112 and a reference area 114 outside the working area 112. In the embodiment, the reference area 114 may be optionally disposed at least on the left and right sides of the working area 112. However, the disclosure is not limited thereto, and the relative positions of the reference area 114 and the working area 112 may be designed according to actual needs.

The light-sensing device 10 also includes multiple light-sensing elements SE. Each light-sensing element SE includes a reading circuit RC. For example, in the embodiment, the reading circuit RC may include a thin film transistor T and a capacitor C. The thin film transistor T includes a first terminal Ta, a second terminal Tb, a control terminal Tc, and a semiconductor pattern Td. The first terminal Ta and the second terminal Tb are respectively electrically connected to two different areas of the semiconductor pattern Td. A gate insulating layer GI is provided between the control terminal Tc and the semiconductor pattern Td. The capacitor C is electrically connected to the second terminal Tb of the thin film transistor T.

In the embodiment, a light-sensing device 100 may further include an insulating layer 150 disposed on the control terminal Tc of the thin film transistor T, and the first terminal Ta and the second terminal Tb of the thin film transistor T are disposed on the insulating layer 150 and are respectively electrically connected to two different areas of the semiconductor pattern Td through contact windows 152 and 154 of the insulating layer 150 and contact windows GIa and GIb of the gate insulating layer GI, but the disclosure is not limited thereto.

The light-sensing device 100 further includes multiple reading lines RL and multiple scanning lines SL that are staggered. The first terminal Ta of the thin film transistor T of each light-sensing element SE is electrically connected to a corresponding reading line RL. The control terminal Tc of the thin film transistor T of each light-sensing element SE is electrically connected to a corresponding scanning line SL.

Each light-sensing element SE further includes a light-sensing stacked structure D electrically connected to the reading circuit RC. The light-sensing stacked structure D includes a first electrode 160 electrically connected to the reading circuit RC, a light-sensing pattern 170 disposed on the first electrode 160, and a second electrode 190 disposed on the light-sensing pattern 170. In the embodiment, the material of the first electrode 160 of the light-sensing stacked structure D may be a reflective material, and the material of the second electrode 190 of the light-sensing stacked structure D may be a transparent material. For example, in the embodiment, the material of the first electrode 160 of the light-sensing stacked structure D may be metal, the material of the second electrode 190 of the light-sensing stacked structure D may be indium tin oxide, and the material of the light-sensing pattern 170 may be silicon-rich oxide (SRO), but the disclosure is not limited thereto.

In the embodiment, each light-sensing element SE further includes a passivation layer 180 disposed on the light-sensing pattern 170 of the light-sensing element SE and has a contact window 182. The second electrode 190 of each light-sensing element SE is electrically connected to the light-sensing pattern 170 through the contact window 182 of the passivation layer 180.

Each light-sensing element SE further includes a first light-blocking structure 210 disposed on the second electrode 190 of the light-sensing stacked structure D. Specifically, in the embodiment, the light-sensing device 10 further includes an insulating layer 200. The insulating layer 200 is disposed on the second electrode 190, and the first light-blocking structure 210 is disposed on the insulating layer 200. For example, in the embodiment, the material of the first light-blocking structure 210 may be metal, but the disclosure is not limited thereto. In addition, in the embodiment, the light-sensing device 10 may also optionally include multiple insulating layers 220, 230, and 240 stacked in sequence, and the multiple insulating layers 220, 230, and 240 cover the first light-blocking structure 210 of each light-sensing element SE. In the embodiment, the first light-blocking structure 210 may have a common potential or a ground potential.

In the embodiment, the first conductive pattern 140 may be disposed between the first electrode 160 of the light-sensing stacked structure D and the semiconductor pattern Td, and the first conductive pattern 140 overlaps the light-sensing pattern 170 in a direction z perpendicular to the substrate 110.

The multiple light-sensing elements SE include multiple working light-sensing elements WSE and multiple reference light-sensing elements RSE. The working light-sensing element WSE is disposed on the working area 112 of the substrate 110, and the reference light-sensing element RSE is disposed on the reference area 114 of the substrate 110.

The construction of the working light-sensing element WSE is substantially the same as the construction of the reference light-sensing element RSE.

One difference between the working light-sensing element WSE and the reference light-sensing element RSE is that the two have different first light-blocking structure 210W and first light-blocking structure 210R. The first light-blocking structure 210W of each working light-sensing element WSE has a light-transmitting opening 212 overlapping the light-sensing pattern 170 of the working light-sensing element WSE. The first light-blocking structure 210R of each reference light-sensing element RSE shields the light-sensing pattern 170 of the reference light-sensing element RSE. In addition, another difference between the working light-sensing element WSE and the reference light-sensing element RSE is that each reference light-sensing element RSE further includes a second light-blocking structure RSM. The first light-blocking structure 210R and the second light-blocking structure RSM of each reference light-sensing element RSE are respectively disposed on the upper and lower sides of the light-sensing pattern 170 of the reference light-sensing element RSE, and the vertical projection of the light-sensing pattern 170 of the reference light-sensing element RSE on the substrate 110 falls within the vertical projection of the second light-blocking structure RSM of the reference light-sensing element RSE on the substrate 110.

For example, in the embodiment, the second light-blocking structure RSM of the reference light-sensing element RSE is disposed between the semiconductor pattern Td of the reference light-sensing element RSE and the substrate 110, and the second light-blocking structure RSM of the reference light-sensing element RSE overlaps the semiconductor pattern Td of the reference light-sensing element RSE and the light-sensing pattern 170 of the reference light-sensing element RSE in the direction z perpendicular to the substrate 110. In the embodiment, the second light-blocking structure RSM may be floating. In the embodiment, the light-sensing device 10 further includes a buffer layer 130 disposed on the second light-blocking structure RSM and located between the semiconductor pattern Td and the substrate 110.

In the embodiment, each working light-sensing element WSE may also include a second light-blocking structure WSM. The first light-blocking structure 210 and the second light-blocking structure WSM of each working light-sensing element WSE are respectively disposed on the upper and lower sides of the light-sensing pattern 170 of the working light-sensing element WSE. Different from the reference light-sensing element RSE, at least a part of the vertical projection of the light-sensing pattern 170 of each working light-sensing element WSE on the substrate 110 falls outside the vertical projection of the second light-blocking structure WSM on the substrate 110. In the embodiment, the second light-blocking structure WSM may be floating.

In the embodiment, the second light-blocking structure RSM of the reference light-sensing element RSE is disposed between the semiconductor pattern Td of the reference light-sensing element RSE and the substrate 110, and the second light-blocking structure RSM of the reference light-sensing element RSE overlaps the semiconductor pattern Td of the reference light-sensing element RSE and the light-sensing pattern 170 of the reference light-sensing element RSE in a direction z perpendicular to the substrate 110.

The light-sensing device 10 may be a fingerprint identification device. A light beam L is used to illuminate the fingerprint (not shown) on the working area 112, and the light-sensing patterns 170 of the multiple working light-sensing elements WSE are configured to receive the light beam L reflected by the fingerprint and then obtain the fingerprint image. A light source BLU is used to provide the light beam L. In the embodiment, the light source BLU may be optionally disposed under the substrate 110. That is to say, in the embodiment, a backlight source may be used to provide the light beam L for illuminating the fingerprint. However, the disclosure is not limited thereto. In other embodiments, a front light source disposed above the substrate 110 is also used to provide the light beam L for illuminating the fingerprint.

After being used for a long time, the light-sensing pattern 170 of the working light-sensing element WSE will be affected by the light beam L and gradually age. In contrast, the first light-blocking structure 210R and the second light-blocking structure RSM are disposed on the upper and lower sides of the reference light-sensing element RSE respectively, and the reference light-sensing element RSE is less prone to aging. The reference light-sensing element RSE may be used to monitor the deterioration degree of the working light-sensing element WSE, and then adjust the illumination brightness of the light source BLU to correct the output gray level of the working light-sensing element WSE. The background noise may be obtained by using the reference light-sensing element RSE; the output gray level of the working light-sensing element WSE may also be corrected by referring to the background noise obtained by the reference light-sensing element RSE, so that the fingerprint signal or the anti-counterfeiting signal may be improved.

The reference light-sensing element (not shown) of the comparative example is similar to the reference light-sensing element RSE of an embodiment of the disclosure. The difference between the two is that the second light-blocking structure RSM is not provided directly under the light-sensing pattern of the reference light-sensing element of the comparative example. The correction effect of using the reference light-sensing element RSE according to an embodiment of the disclosure is better described below with reference to FIG. 4.

Figure 4:
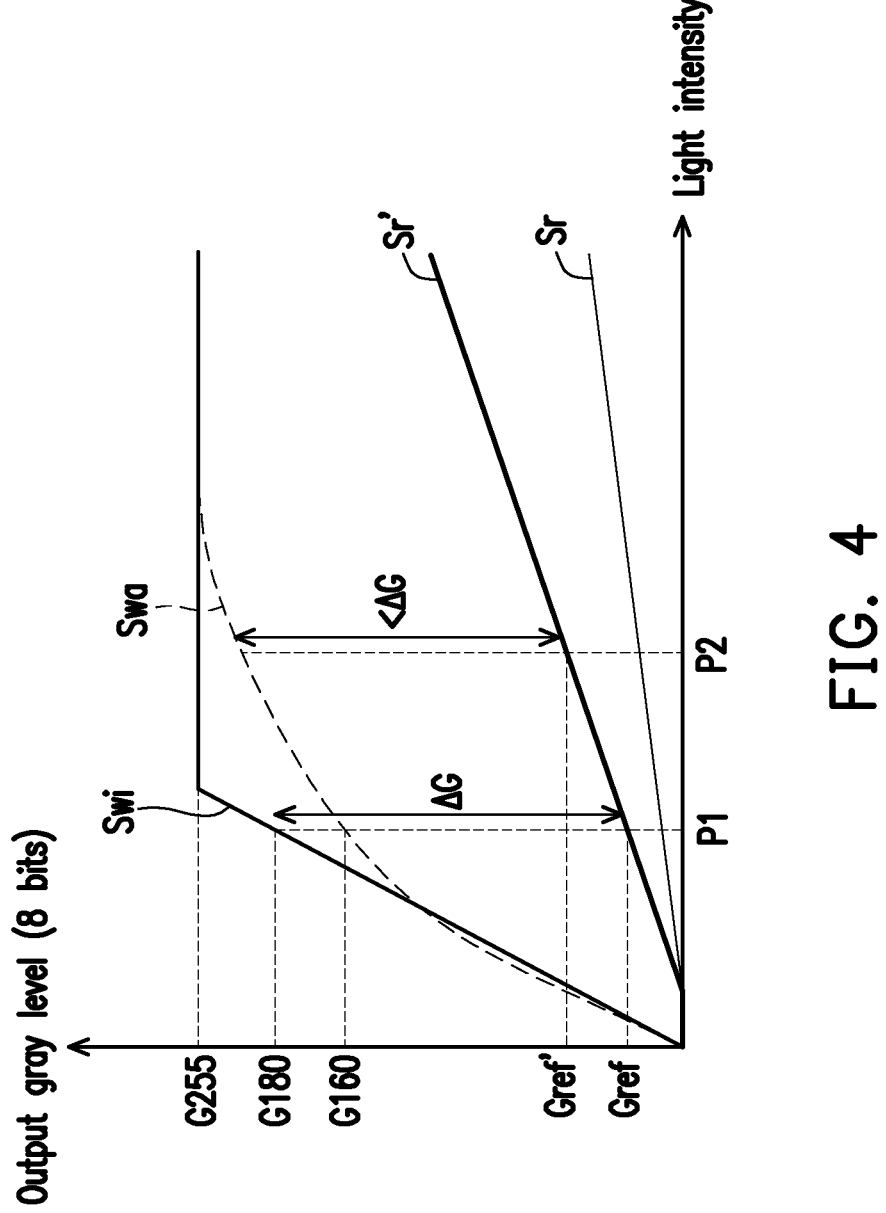
FIG. 4 shows a relationship curve between a light intensity of a light source and an output gray level of a light-sensing element.

FIG. 4 shows a relationship curve between a light intensity of a light source and an output gray level of a light-sensing element. FIG. 4 shows an initial relationship curve Swi of the light intensity of the light source BLU and the output gray level of the working light-sensing element WSE of an embodiment of the disclosure. The initial relationship curve Swi represents the relationship between the light intensity of the light source BLU before the working light-sensing element WSE is deteriorated and the output gray level of the working light-sensing element WSE. FIG. 4 also shows a deterioration relationship curve Swa between the light intensity of the light source BLU and the output gray level of the working light-sensing element WSE of an embodiment. The deterioration relationship curve Swa represents the relationship between the light intensity of the light source BLU and the output gray level of the working light-sensing element WSE after the working light-sensing element WSE is deteriorated. FIG. 4 also shows a relationship curve Sr between the light intensity of the light source BLU and the output gray level of the reference light-sensing element RSE of an embodiment of the disclosure. FIG. 4 also shows a relationship curve Sr' between the light intensity of the light source BLU and the output gray level of the reference light-sensing element of the comparative example.

Please refer to FIG. 1, FIG. 2A, FIG. 3, and FIG. 4. The relationship curve Sr of the reference light-sensing element RSE is configured to correct the output gray level of the working light-sensing element WSE. The difference ΔG between the average gray level of the sensing area and the average gray level Gref under a brightness P1 is defined as the reference point before deterioration. Taking the average output gray level G180 of the sensing area as an example, ΔG=G180–Gref, and when the working light-sensing element WSE is deteriorated, the light intensity of the light source BLU is adjusted to P2 to maintain the difference of ΔG, but Gref will also change to Gref', that is, ΔG=G180–Gref=G(P2)–Gref'. If the light-shielding effect of the reference light-sensing element of comparative example is not favorable, the Gref' thereof may not be able to meet ΔG due to an increase too high, such as the trend of the relationship curve Sr'. At the same time, under the change of the light intensity of the light source BLU, the reference light-sensing element RSE must satisfy the condition where the difference between the average output gray level of the working area and the average gray level of the reference area at least meets the gray level change (8 bit) of G0~G200.

It is worth mentioning that, through the second light-blocking structure RSM of the reference light-sensing element RSE, the reference light-sensing element RSE of an embodiment of the disclosure may block more light beams L from illuminating the light-sensing pattern 170 thereof, so that the relationship curve Sr is relatively gentle. The reference light-sensing element RSE is effective in correcting the deteriorated working light-sensing element WSE. The light-sensing device 10 may correct the background noise and photodeterioration by using the reference light-sensing element RSE.

It must be noted here that the following embodiments continue to use the referential numbers of the components and a part of the contents of the foregoing embodiments, wherein the same referential numbers are used to denote the same or similar components, and description of the same technical content is omitted. For the description of the omitted part, reference may be made to the foregoing embodiments, and the details are not repeated here.

Figure 2B:
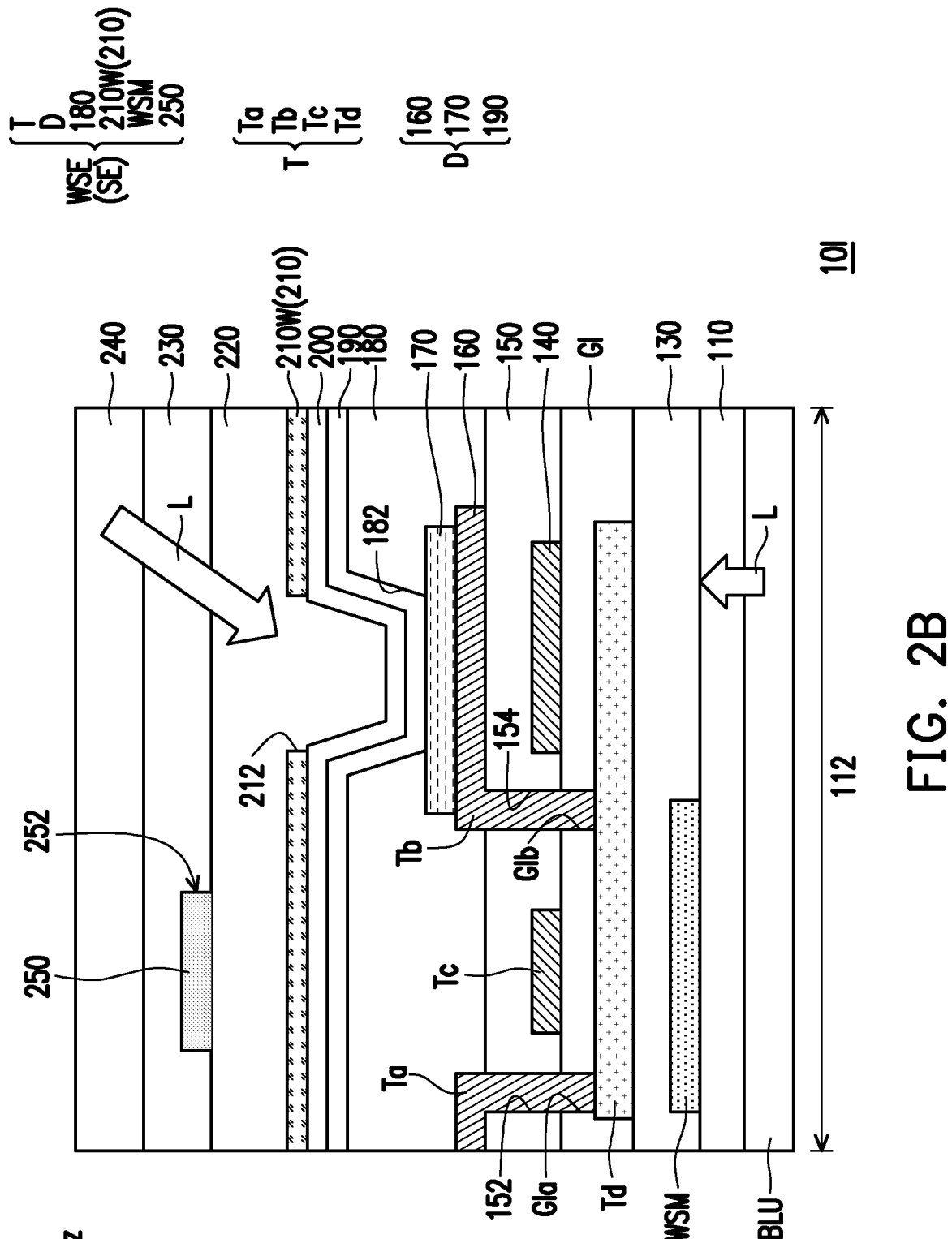
FIG. 2B is a schematic cross-sectional view of a light-sensing device according to another embodiment of the disclosure.

FIG. 2B is a schematic cross-sectional view of a light-sensing device according to another embodiment of the disclosure. A light-sensing device 101 of FIG. 2B is similar to the light-sensing device 10 of FIG. 2A. The difference between the two is that each light-sensing element SE of FIG. 2B further includes a shielding layer 250 disposed on the first light-blocking structure 210 of the light-sensing element SE. The first light-blocking structure 210 is disposed between the shielding layer 250 and the light-sensing pattern 170. In the embodiment, the shielding layer 250 may be disposed between the insulating layer 220 and the insulating layer 230. In the embodiment, the material of the shielding layer 250 is, for example, metal, but the disclosure is not limited thereto. In the embodiment, the shielding layer 250 may have a ground potential, but the disclosure is not limited thereto.

Figure 5:
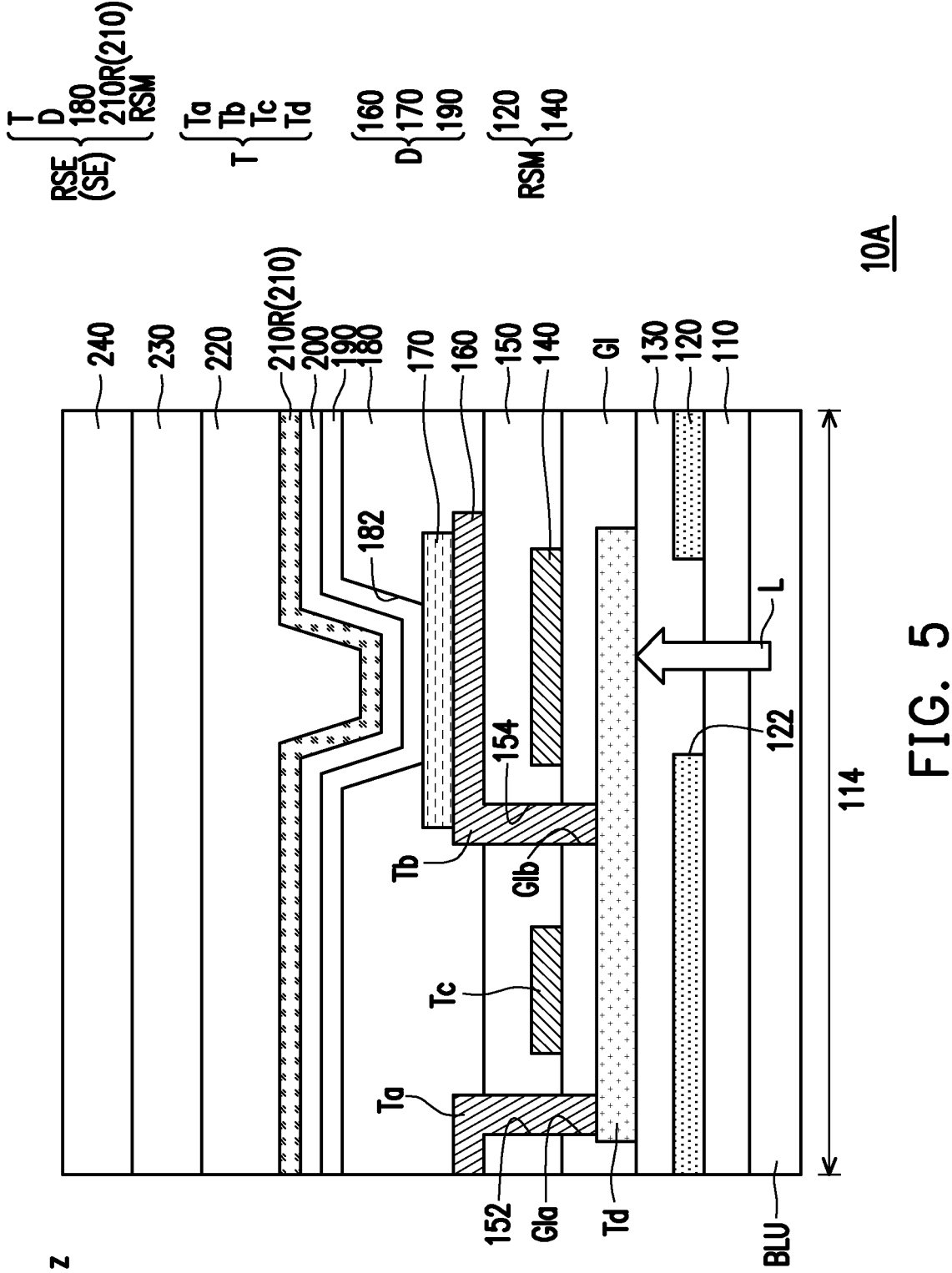
FIG. 5 is a schematic cross-sectional view of a light-sensing device according to another embodiment of the disclosure.

FIG. 5 is a schematic cross-sectional view of a light-sensing device according to another embodiment of the disclosure. In particular, FIG. 5 shows the reference light-sensing element RSE of a light-sensing device 10A.

Figure 6:
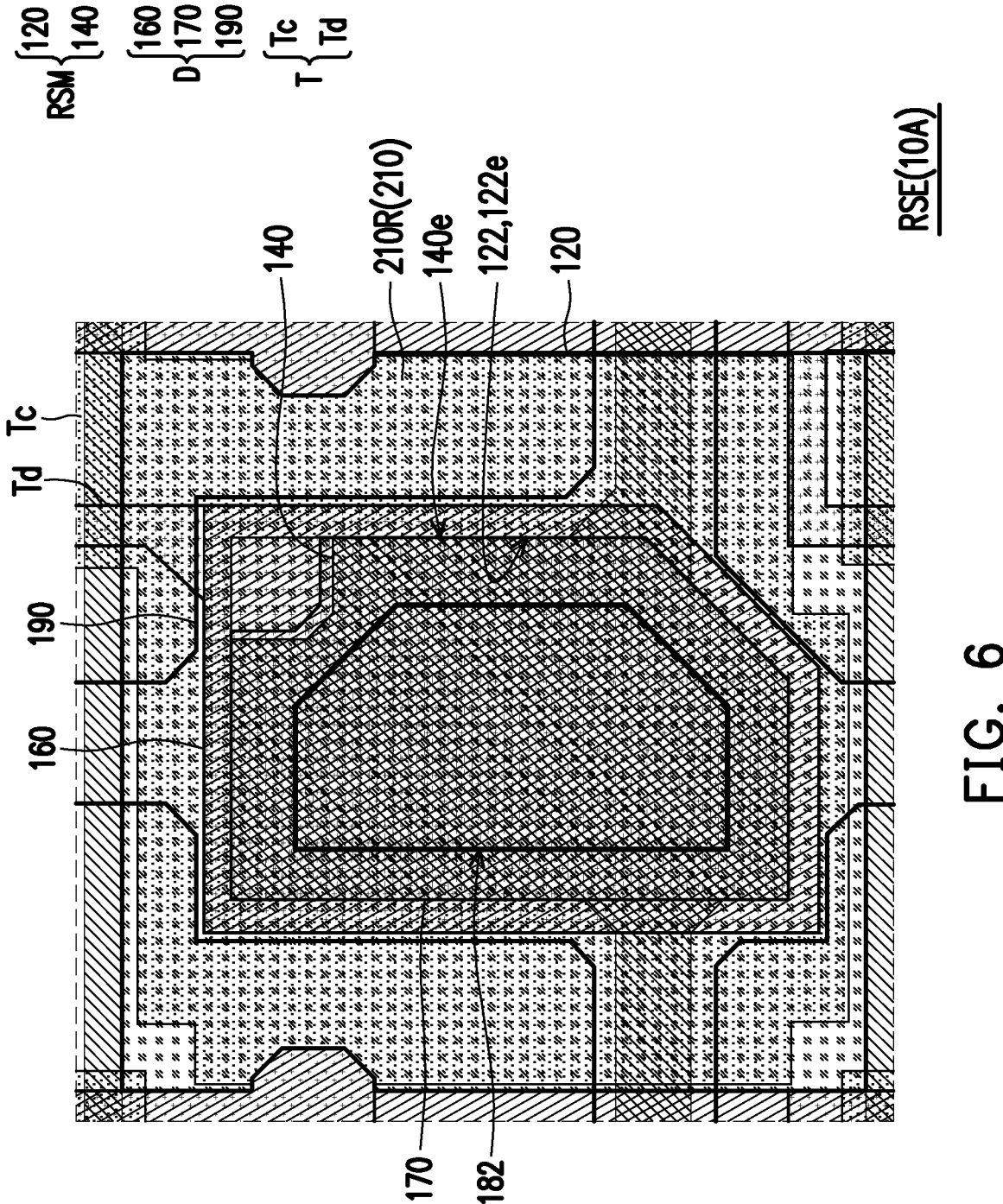
FIG. 6 is a schematic top view of a light-sensing device according to another embodiment of the disclosure.

FIG. 6 is a schematic top view of a light-sensing device according to another embodiment of the disclosure. In particular, FIG. 6 shows the control terminal Tc and the semiconductor pattern Td of the thin film transistor T of the reference light-sensing element RSE, the first electrode 160, the light-sensing pattern 170, and the second electrode 190 of the light-sensing stacked structure D of the reference light-sensing element RSE, the contact window 182, the first light-blocking structure 210R of the reference light-sensing element RSE, and the second light-blocking structure RSM of the reference light-sensing element RSE.

Figure 7:
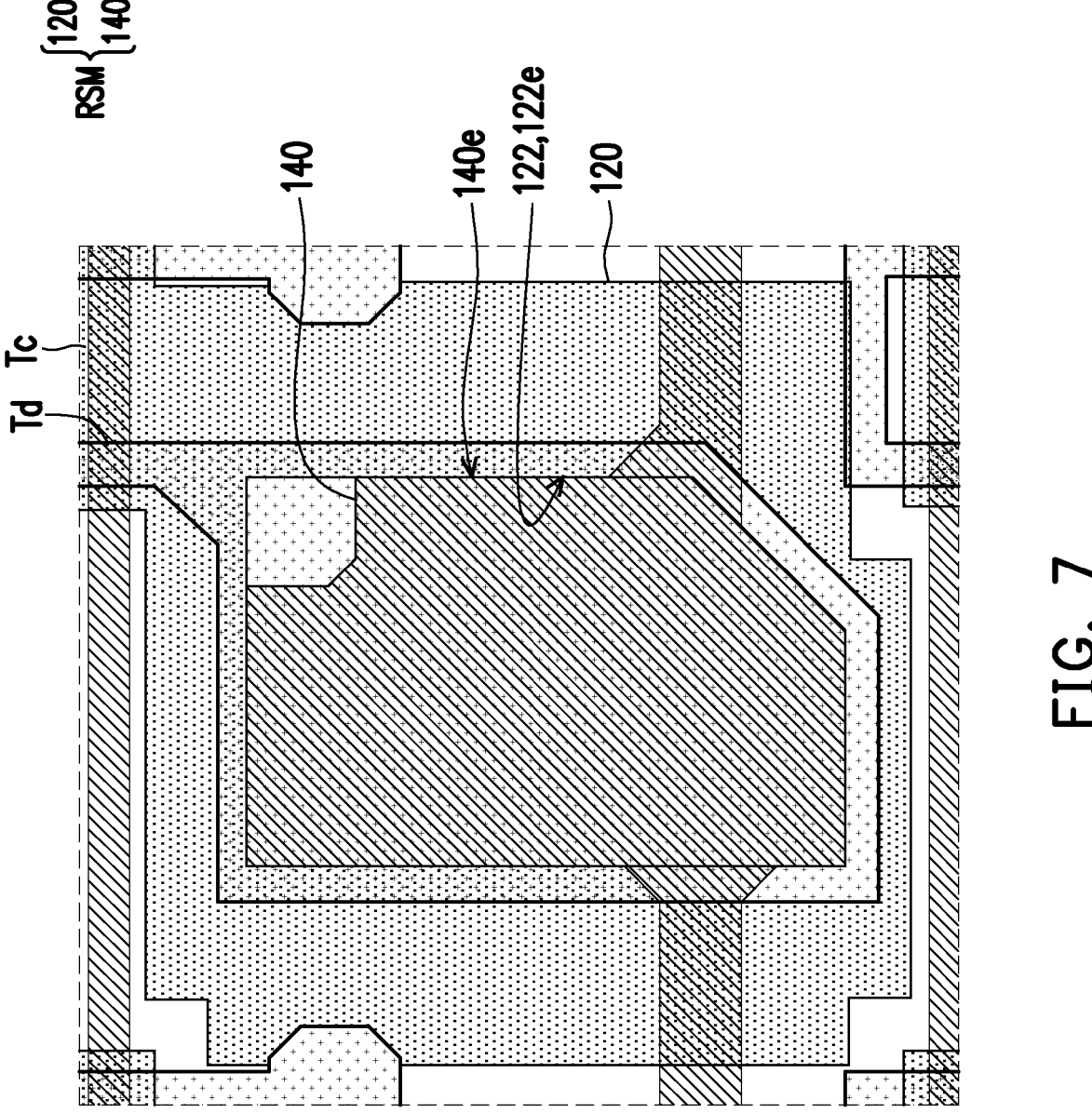
FIG. 7 shows the control terminal and the semiconductor pattern of the thin film transistor of the reference light-sensing element of FIG. 6 and the second light-blocking structure of the reference light-sensing element.
Figure 8:
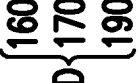
FIG. 8 shows the first electrode, the light-sensing pattern, the second electrode, and the contact window of the light-sensing stacked structure of the reference light-sensing element of FIG. 6.
Figure 8:
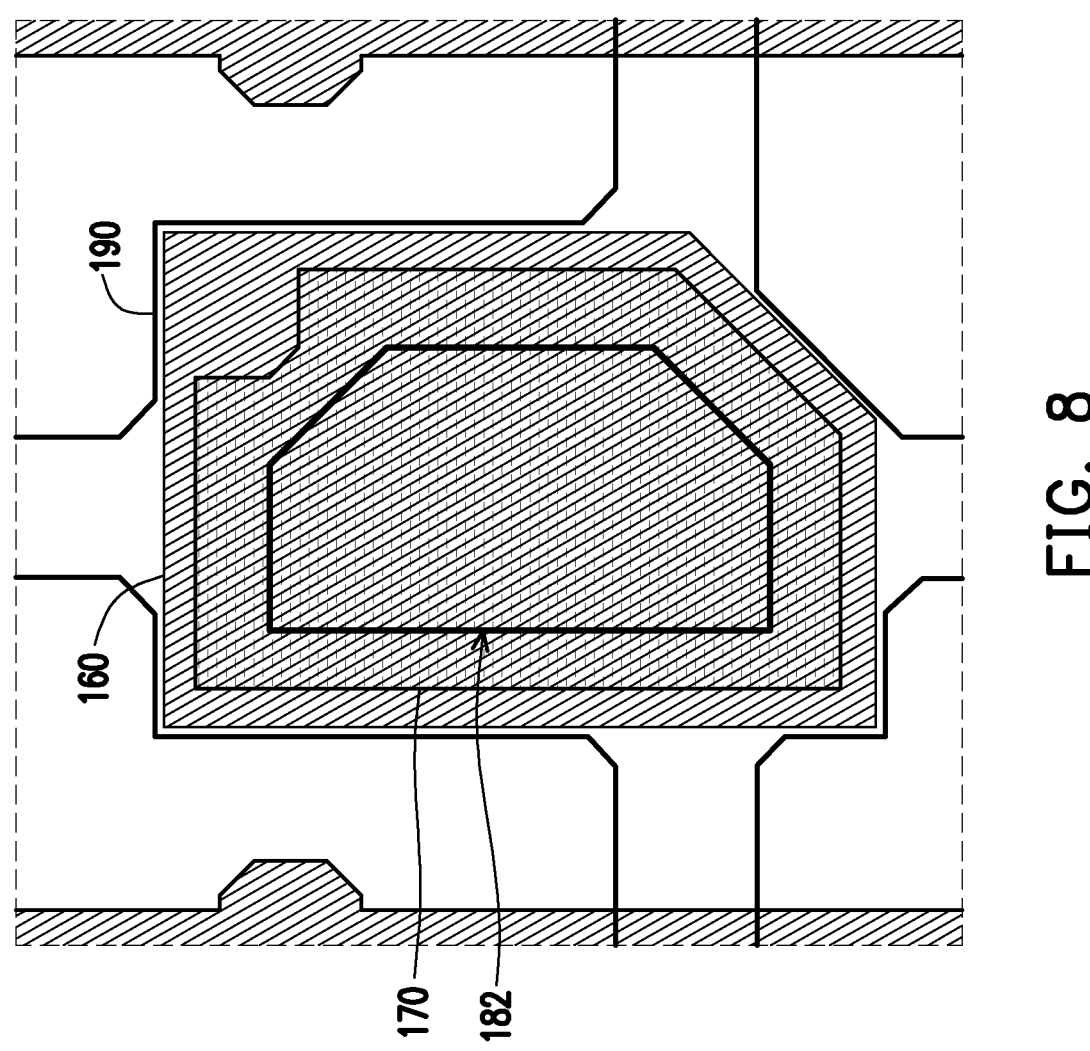

FIG. 7 shows the control terminal Tc and the semiconductor pattern Td of the thin film transistor T of the reference light-sensing element RSE of FIG. 6 and the second light-blocking structure RSM of the reference light-sensing element RSE. FIG. 8 shows the first electrode 160, the light-sensing pattern 170, the second electrode 190, and the contact window 182 of the light-sensing stacked structure D of the reference light-sensing element RSE of FIG. 6.

Please refer to FIG. 5. The light-sensing device 10A of the embodiment is similar to the aforementioned light-sensing device 10. The difference between the two is that the second light-blocking structure RSM of the reference light-sensing element RSE of the light-sensing device 10A and the second light-blocking structure RSM of the reference light-sensing element RSE of the light-sensing device 10 are different.

Please refer to FIG. 5, FIG. 6, FIG. 7, and FIG. 8. Specifically, in the embodiment, the second light-blocking structure RSM of the light-sensing element RSE includes a bottom light-shielding pattern 120 and the first conductive pattern 140. The bottom light-shielding pattern 120 is disposed on the substrate 110. The first conductive pattern 140 is disposed above the bottom light-shielding pattern 120. The bottom light-shielding pattern 120 has an opening 122, and the first conductive pattern 140 shields the opening 122 of the bottom light-shielding pattern 120. In other words, in the embodiment, the second light-blocking structure RSM is composed of the first conductive pattern 140 and the bottom light-shielding pattern 120 belonging to two different film layers. In particular, the bottom light-shielding pattern 120 of the second light-blocking structure RSM has an opening 122 overlapping the first conductive pattern 140, so as to reduce the coupling effect between the bottom light-shielding pattern 120 and the first conductive pattern 140 and improve the electrical performance of the light-sensing device 10A.

Referring to FIG. 7, in the embodiment, an edge 140e of the first conductive pattern 140 and an edge 122e of the opening 122 of the bottom light-shielding pattern 120 may be substantially aligned. However, the disclosure is not limited thereto. In other embodiments, the edge 122e of the opening 122 of the bottom light-shielding pattern 120 may also be retracted under the first conductive pattern 140, so that there is an overlapping area provided by the bottom light-shielding pattern 120 and the first conductive pattern 140 to avoid the problem of light leakage caused by process variation (that is, the alignment offset between the bottom light-shielding pattern 120 and the first conductive pattern 140). The width of the overlapping area is, for example, 1-2 um.

Figure 9:
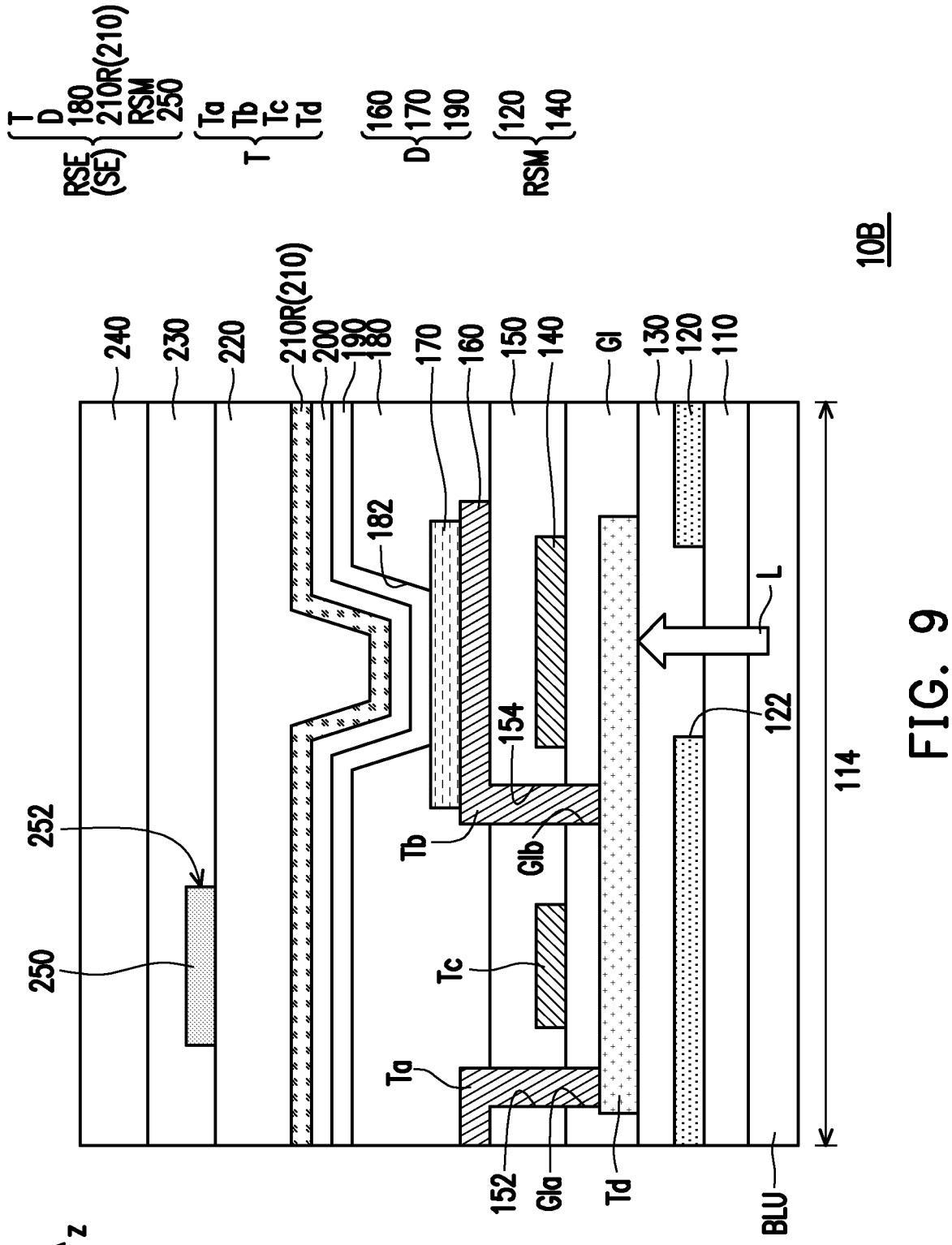
FIG. 9 is a schematic cross-sectional view of a light-sensing device according to yet another embodiment of the disclosure.
Figure 10:
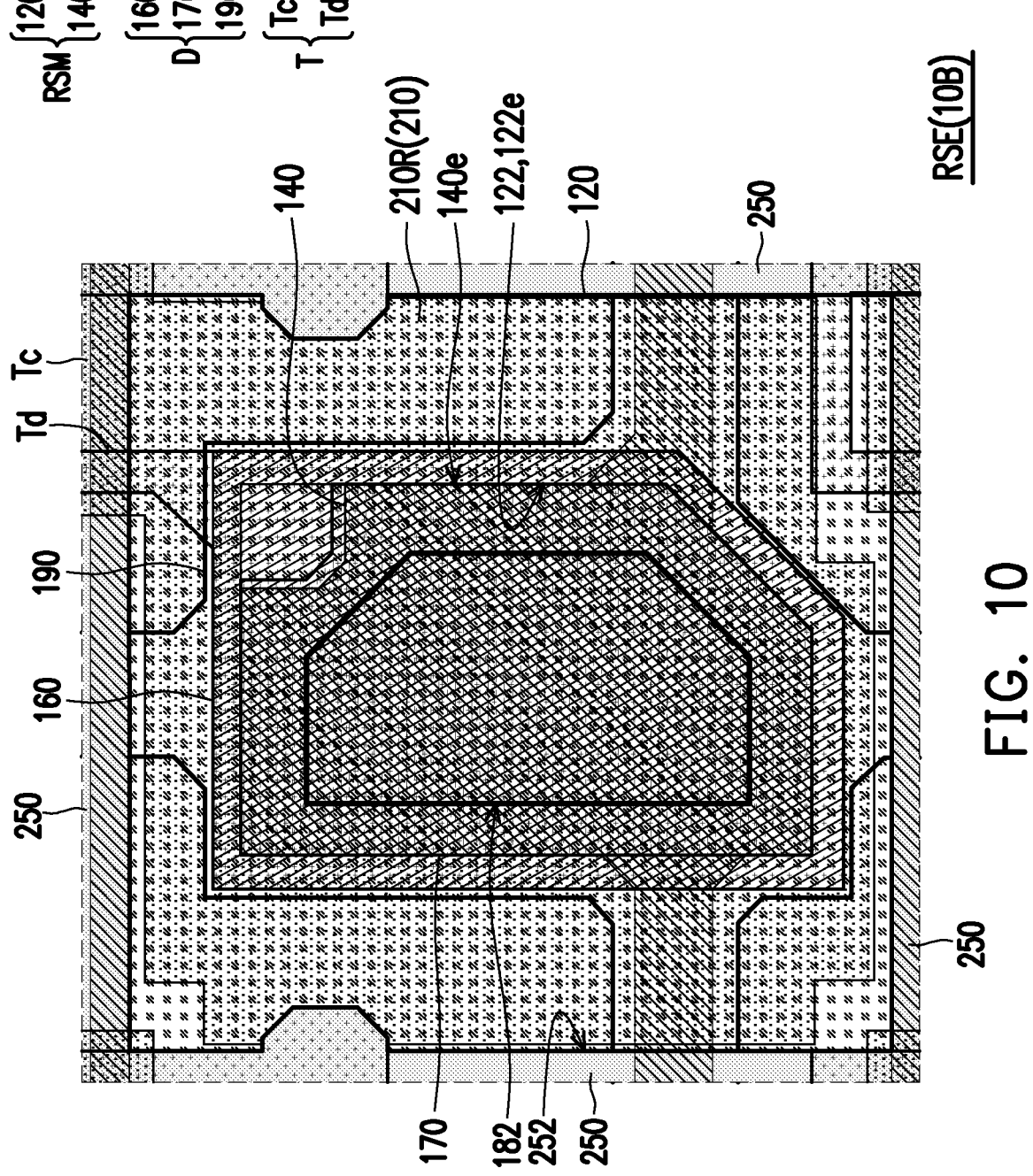
FIG. 10 is a schematic top view of a light-sensing device according to another embodiment of the disclosure.

FIG. 9 is a schematic cross-sectional view of a light-sensing device according to yet another embodiment of the disclosure. FIG. 10 is a schematic top view of a light-sensing device according to another embodiment of the disclosure.

Please refer to FIG. 9 and FIG. 10. A light-sensing device 10B of the embodiment is similar to the aforementioned light-sensing device 10A. The difference between the two is that the light-sensing element SE of the light-sensing device 10B and the light-sensing element SE of the light-sensing device 10A are different.

Please refer to FIG. 9 and FIG. 10. Specifically, in the embodiment, each light-sensing element SE further includes a shielding layer 250 disposed on the first light-blocking structure 210 of the light-sensing element SE. The first light-blocking structure 210 is disposed between the shielding layer 250 and the light-sensing pattern 170. In the embodiment, the shielding layer 250 may be disposed between the insulating layer 230 and the insulating layer 240. In the embodiment, the material of the shielding layer 250 is, for example, metal, but the disclosure is not limited thereto. In the embodiment, the shielding layer 250 may have a ground potential, but the disclosure is not limited thereto.

The shielding layer 250 of each light-sensing element SE has an opening 252 overlapping the light-sensing pattern 170. In the embodiment, the opening 252 of the shielding layer 250 of each reference light-sensing element RSE overlaps the second light-blocking structure RSM of the reference light-sensing element RSE. In the embodiment, the opening 122 of the bottom light-shielding pattern 120 of each reference light-sensing element RSE overlaps the opening 252 of the shielding layer 250 of the reference light-sensing element RSE. The shielding layer 250 may be disposed on the working light-sensing element WSE of the working area 112, which may shield the coupling noise caused by fingers above the working light-sensing element WSE, and the opening 252 of the shielding layer 250 may also be used as another open cell structure on the light-transmitting opening 212 of the first light-blocking structure 210 to form a light-receiving angle design. When placed above the reference light-sensing element RSE of the reference area 114, the shielding layer 250 may extend arbitrarily in the reference area 114 and overlap above the first light-blocking structure 210 as another light-blocking structure so as to avoid the risk of light transmission in the first light-blocking structure 210. That is to say, in another embodiment, the shielding layer 250 disposed above the reference light-sensing element RSE of the reference area 114 may also cover the entire surface like the first light-blocking structure 210R of the reference light-sensing element RSE.

Figure 11:
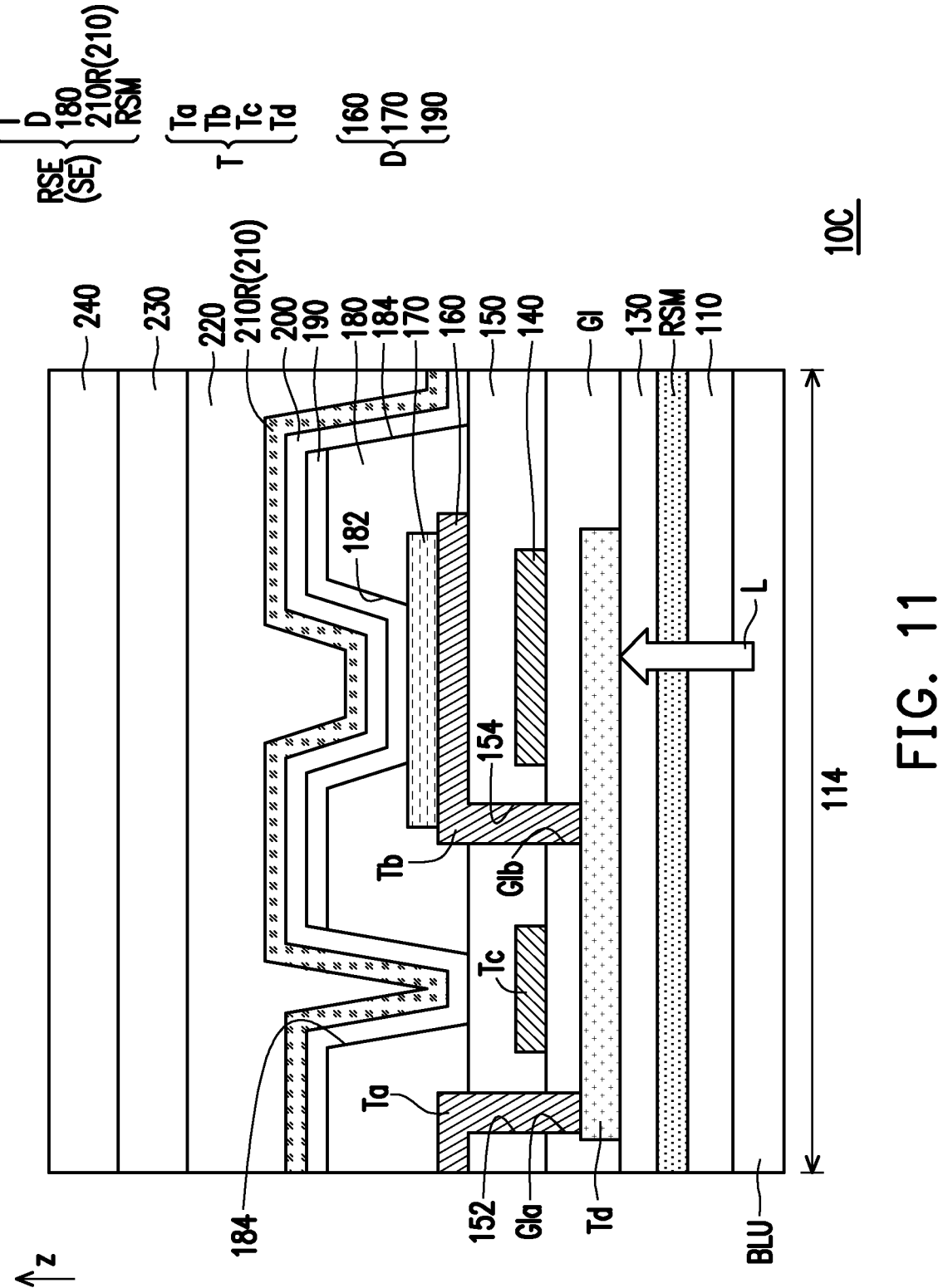
FIG. 11 is a schematic cross-sectional view of a light-sensing device according to yet another embodiment of the disclosure.
Figure 12:
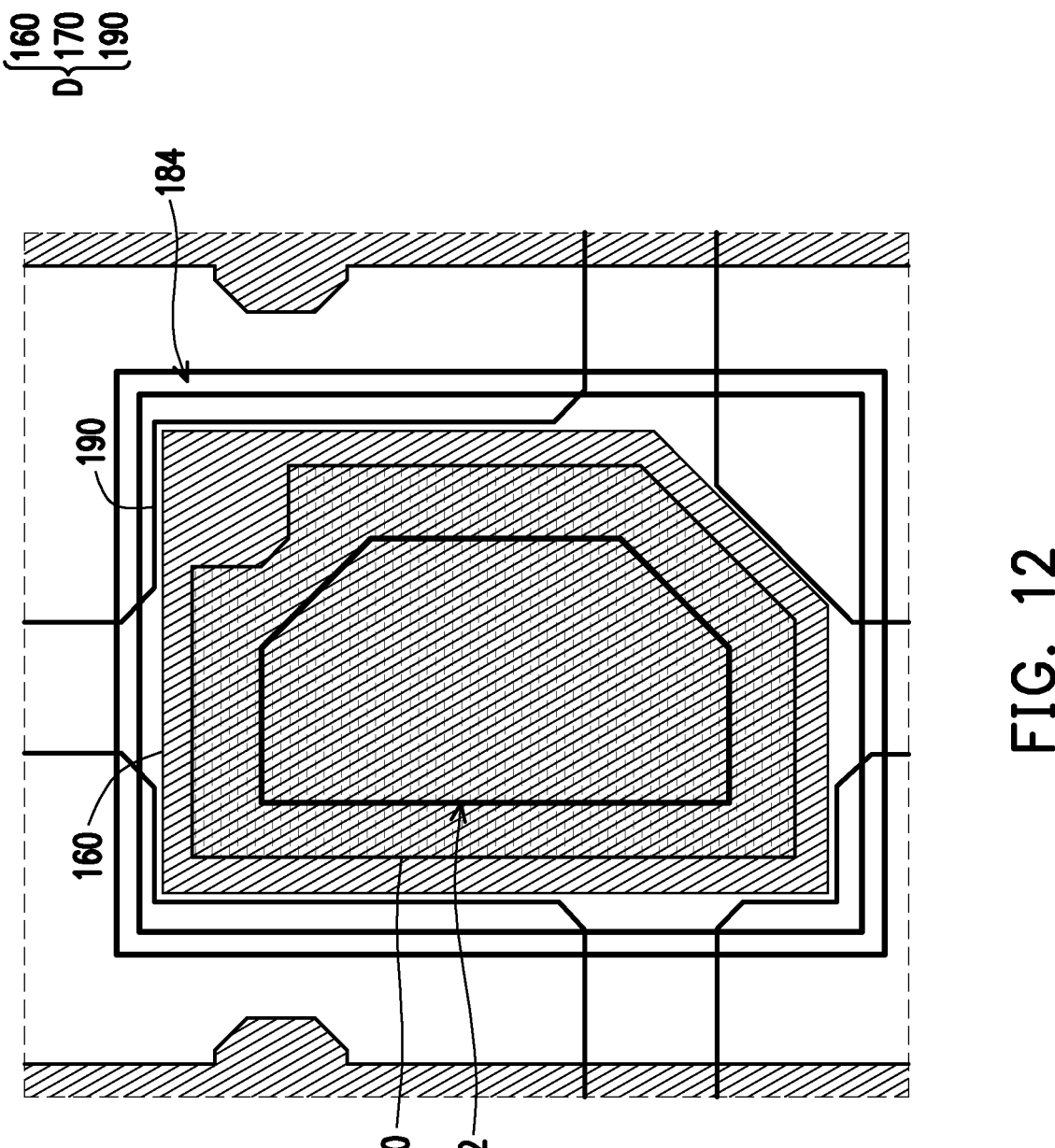
FIG. 12 is a schematic top view of a first electrode, a light-sensing pattern, a second electrode, and a contact window and a groove of a passivation layer of a light-sensing stacked structure of a reference light-sensing element according to yet another embodiment of the disclosure.

FIG. 11 is a schematic cross-sectional view of a light-sensing device according to yet another embodiment of the disclosure. FIG. 12 is a schematic top view of a first electrode, a light-sensing pattern, a second electrode, and a contact window and a groove of a passivation layer of a light-sensing stacked structure of a reference light-sensing element according to yet another embodiment of the disclosure.

Please refer to FIG. 11 and FIG. 12. A light-sensing device 10C of the embodiment is similar to the aforementioned light-sensing device 10. The difference between the two is that the passivation layer 180 of the light-sensing device 10C and the passivation layer 180 of the light-sensing device 10 are different. Specifically, in the embodiment, the passivation layer 180 of the reference light-sensing element RSE has a groove 184 in addition to the contact window 182. The groove 184 is located beside the light-sensing pattern 170 of the reference light-sensing element RSE, and the first light-blocking structure 210R of the reference light-sensing element RSE is filled into the groove 184. The part of the first light-blocking structure 210R filled in the groove 184 forms a side light-blocking structure, which may prevent the light beam L from passing from the side of the light-sensing pattern 170 to the light-sensing pattern 170. Through the part of the first light-blocking structure 210R filled in the groove 184, the reference light-sensing element RSE is less prone to be affected by the light beam L and may perform a better function of correcting the working light-sensing element WSE (please refer to FIG. 1 and FIG. 2A).

In the embodiment, the groove 184 of the passivation layer 180 may surround the light-sensing pattern 170 of the reference light-sensing element RSE. For example, in the embodiment, the groove 184 of the passivation layer 180 may be in the shape of a square, but the disclosure is not limited thereto. In other embodiments, the passivation layer 180 may also be designed in other appropriate shapes.

Figure 13:
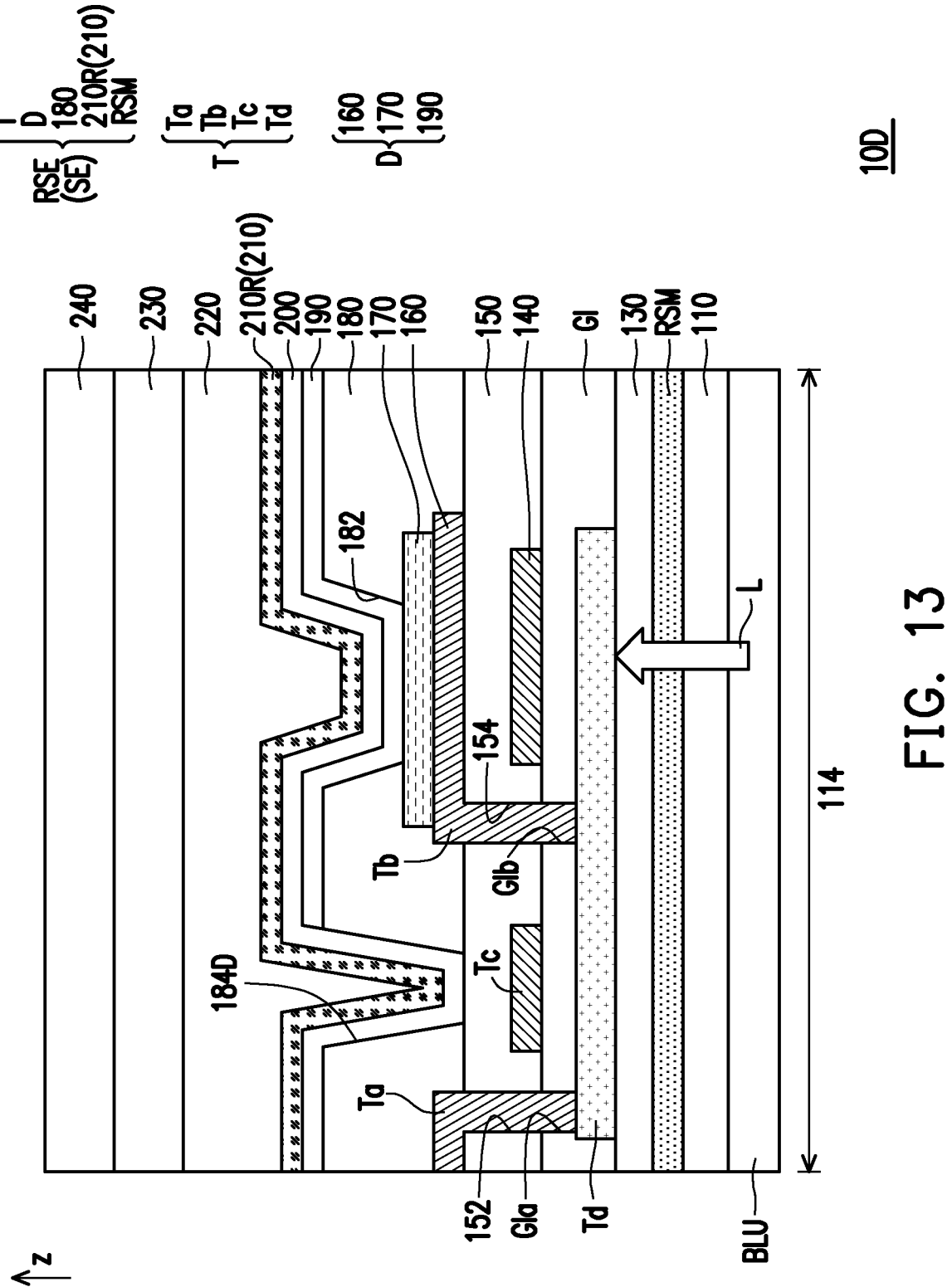
FIG. 13 is a schematic cross-sectional view of a light-sensing device according to still another embodiment of the disclosure.
Figure 14:
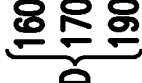
FIG. 14 is a schematic top view of a first electrode, a light-sensing pattern, a second electrode, and a contact window and a groove of a passivation layer of a light-sensing stacked structure of a reference light-sensing element according to still another embodiment of the disclosure.
Figure 14:
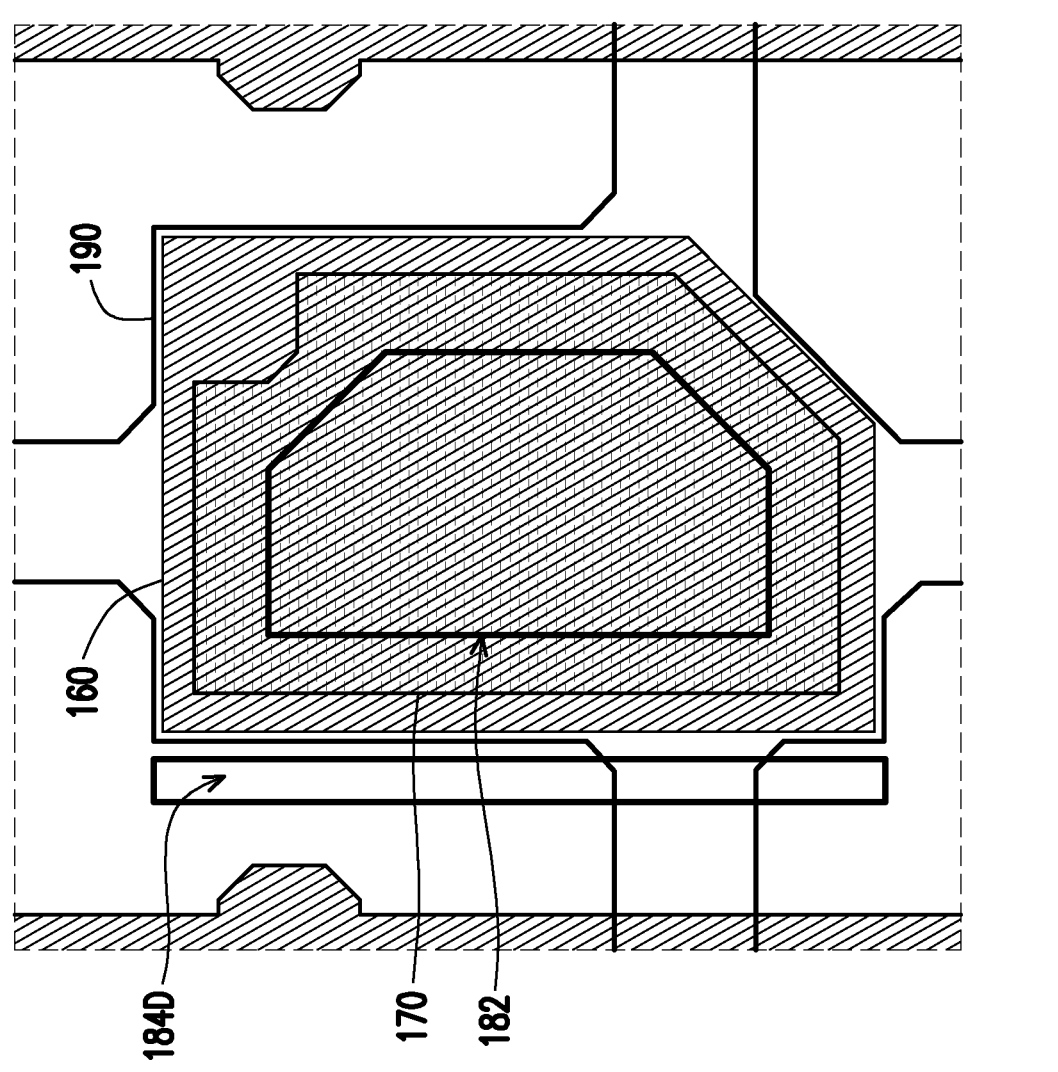

FIG. 13 is a schematic cross-sectional view of a light-sensing device according to still another embodiment of the disclosure. FIG. 14 is a schematic top view of a first electrode, a light-sensing pattern, a second electrode, and a contact window and a groove of a passivation layer of a light-sensing stacked structure of a reference light-sensing element according to still another embodiment of the disclosure.

Please refer to FIG. 13 and FIG. 14. A light-sensing device 10D of the embodiment is similar to the aforementioned light-sensing device 10C. The difference between the two is that a groove 184D of the passivation layer 180 of the light-sensing device 10D and the groove 184 of the passivation layer 180 of the light-sensing device 10C are different. Specifically, in the embodiment, the groove 184D of the passivation layer 180 of the light-sensing device 10D is disposed on a single side of the light-sensing pattern 170 of the reference light-sensing element RSE. For example, when a reference light-sensing element RSE is located on the right side of the working area 112, the groove 184D is disposed on the left side of the light-sensing pattern 170 of the reference light-sensing element RSE so as to block the light beam L from the left side, but the disclosure is not limited thereto. In the embodiment, the groove 184D of the passivation layer 180 may be in a straight shape, but the disclosure is not limited thereto.

Figure 15:
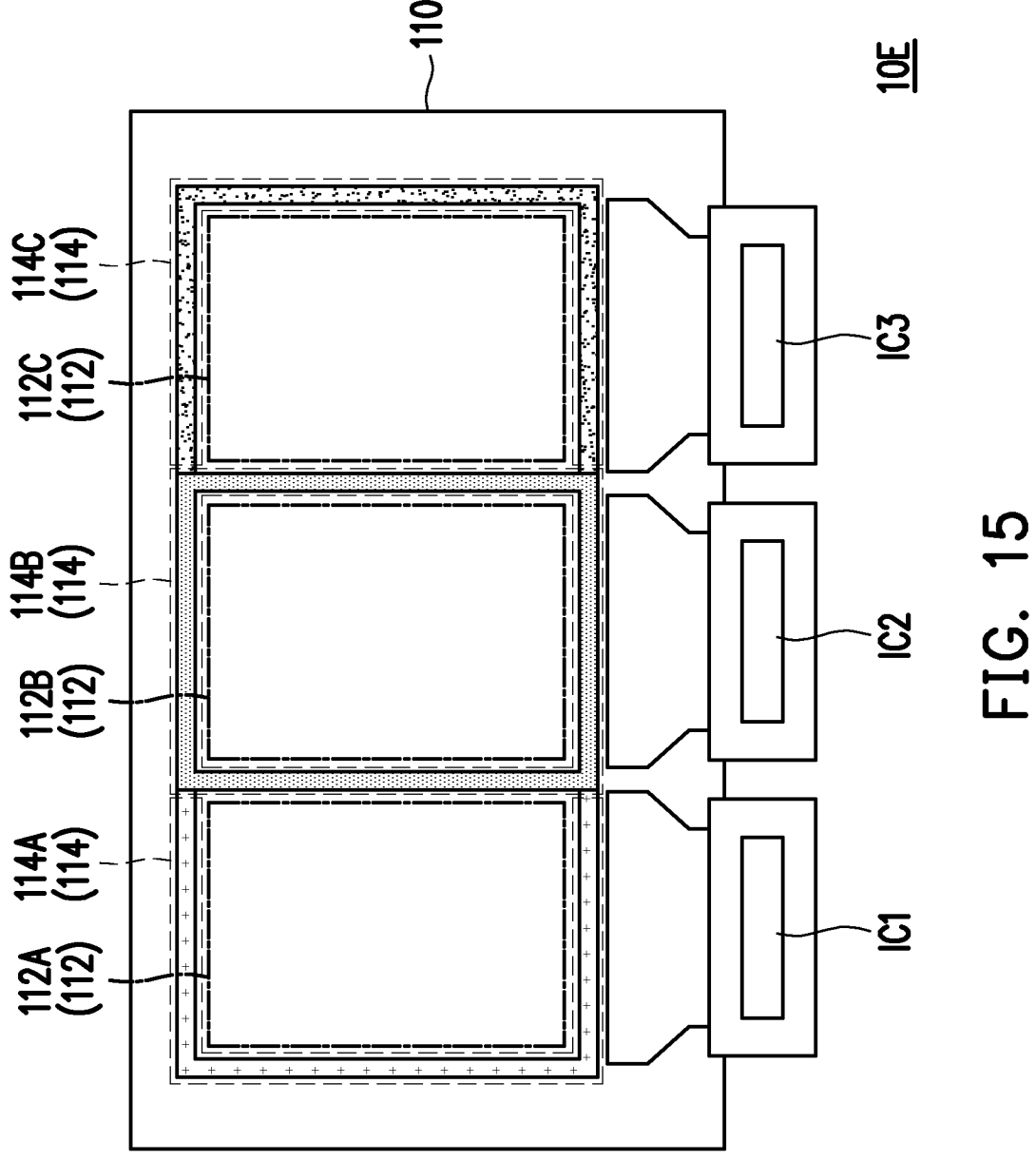
FIG. 15 is a schematic diagram of a light-sensing device according to an embodiment of the disclosure.
Figure 16:
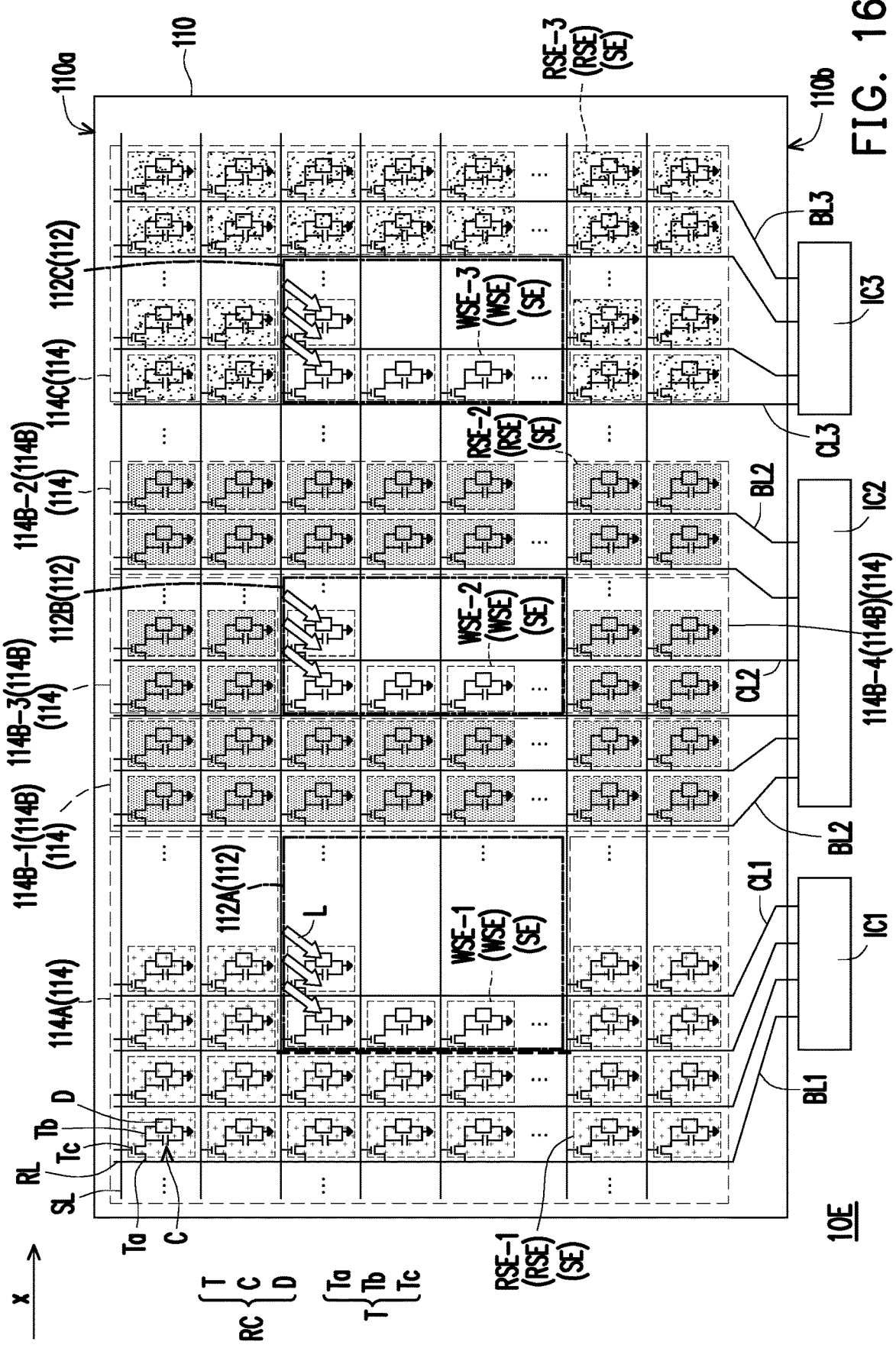
FIG. 16 is a schematic diagram of a light-sensing device according to an embodiment of the disclosure.

FIG. 15 is a schematic diagram of a light-sensing device according to an embodiment of the disclosure. FIG. 16 is a schematic diagram of a light-sensing device according to an embodiment of the disclosure. FIG. 15 shows a first working area 112A, a second working area 112B, a third working area 112C, a first reference area 114A, a second reference area 114B, a third reference area 114C, a first processing element IC1, a second processing element IC2, and a third processing element IC3 of the substrate 110 of FIG. 16, while other components are omitted.

Please refer to FIG. 15 and FIG. FIG. 16. A light-sensing device 10E of the embodiment is similar to the aforementioned light-sensing devices 10 and 10A-10D. In the embodiment, the first working area 112A, the second working area 112B, the third working area 112C, the first reference area 114A, the second reference area 114B, the third reference area 114C, and the connection relationship between the multiple working light-sensing elements WSE and the multiple reference light-sensing elements RSE located in the first working area 112A, the second working area 112B, the third working area 112C, the first reference area 114A, the second reference area 114B, and the third reference area 114C and the first processing element IC1, the second processing element IC2, and the third processing element IC3 are shown more clearly.

In the embodiment, the working area 112 of the substrate 110 includes the first working area 112A, the second working area 112B, and the third working area 112C, and the reference area 114 of the substrate 110 includes the first reference area 114A, the second reference area 114B, and the third reference area 114C. The first working area 112A, the second working area 112B, and the third working area 112C are arranged sequentially in a first direction x, and the first reference area 114A, the second reference area 114B, and the third reference area 114C are respectively disposed corresponding to the first working area 112A, the second working area 112B, and the third working area 112C.

In the embodiment, the multiple working light-sensing elements WSE of the light-sensing device 10E include multiple first working light-sensing elements WSE-1, multiple second working light-sensing elements WSE-2, and multiple third working light-sensing elements WSE-3 respectively disposed in the first working area 112A, the second working area 112B, and the third working area 112C. The multiple reference light-sensing elements RSE of the light-sensing device 10E includes multiple first reference light-sensing elements RSE-1, multiple second reference light-sensing elements RSE-2, and multiple third reference light-sensing elements RSE-3 respectively disposed in the first reference area 114A, the second reference area 114B, and the third reference area 114C.

In the embodiment, the light-sensing device 10E includes the first processing element IC1, the second processing element IC2, and the third processing element IC3. The multiple first working light-sensing elements WSE-1 are electrically connected to the first processing element IC1, the multiple second working light-sensing elements WSE-2 are electrically connected to the second processing element IC2, and the multiple third working light-sensing elements WSE-3 are electrically connected to the third processing element IC3. In particular, the multiple first reference light-sensing elements RSE-1, the multiple second reference light-sensing elements RSE-2, and the multiple third reference light-sensing elements RSE-3 are respectively electrically connected to the first processing element IC1, the second processing element IC2, and the third processing element IC3. In the embodiment, the first processing element IC1, the second processing element IC2, and the third processing element IC3 are respectively, for example, multiple integrated circuits.

The multiple output gray levels corresponding to the multiple first working light-sensing elements WSE-1 are corrected according to multiple reference signals of the multiple first reference light-sensing elements RSE-1. The multiple output gray levels corresponding to the multiple second working light-sensing elements WSE-2 are corrected according to multiple reference signals of the multiple second reference light-sensing elements RSE-2. The multiple output gray levels corresponding to the multiple third working light-sensing elements WSE-3 are corrected according to multiple reference signals of the multiple third reference light-sensing elements RSE-3.

In the embodiment, the multiple first working light-sensing elements WSE-1 and the multiple first reference light-sensing elements RSE-1 are electrically connected to the same first processing element IC1, the multiple second working light-sensing elements WSE-2 and the multiple second reference light-sensing elements RSE-2 are electrically connected to the same second processing element IC2, and the multiple third working light-sensing elements WSE-3 and the multiple third reference light-sensing elements RSE-3 are electrically connected to the same third processing element IC3. That is to say, each working light-sensing element WSE is corrected by using the reference light-sensing element RSE electrically connected to the same processing element, and the circuit background noise of each working light-sensing element WSE is the same or similar as the circuit background noise of the reference light-sensing element RSE used for correction, so the correction effect is favorable.

In the embodiment, the second reference area 114B includes a first sub-area 114B-1.

The first portion of the multiple second reference light-sensing elements RSE-2 is disposed in the first sub-area 114B-1 of the second reference area 114B. The first sub-area 114B-1 of the second reference area 114B is located between the first working area 112A and the second working area 112B. The first sub-area 114B-1 of the second reference area 114B is provided with at least one row of second reference light-sensing elements RSE-2. In the embodiment, the first sub-area 114B-1 of the second reference area 114B provided with two rows of second reference light-sensing elements RSE-2 is used as an example. However, the disclosure is not limited thereto, and the number of rows of the second reference light-sensing elements RSE-2 disposed in the first sub-area 114B-1 of the second reference area 114B may be determined according to actual needs. When there is a greater number of rows of the second reference light-sensing elements RSE-2, the correction effect may be better. In an embodiment not shown, the number of rows of the second reference light-sensing elements RSE-2 disposed in the first sub-area 114B-1 of the second reference area 114B may be 3 or more rows. However, the disclosure is not limited thereto. In another embodiment not shown, the number of rows of the second reference light-sensing elements RSE-2 disposed in the first sub-area 114B-1 of the second reference area 114B may also be 1 row, and the interpolation method may be used to correct the second reference light-sensing elements RSE-2, so that the output gray level of the working area 112 may avoid discontinuous sensing images due to the reference light-sensing elements RSE.

In the embodiment, the second reference area 114B further includes a second sub-area 114B-2. The second portion of the multiple second reference light-sensing elements RSE-2 is disposed in the second sub-area 114B-2 of the second reference area 114B. The second sub-area 114B-2 of the second reference area 114B is located between the second working area 112B and the third working area 112C. The second sub-area 114B-2 of the second reference area 114B is provided with at least one row of second reference light-sensing elements RSE-2. In the embodiment, the second sub-area 114B-2 of the second reference area 114B provided with two rows of second reference light-sensing elements RSE-2 is used as an example. However, the disclosure is not limited thereto, and the number of rows of the second reference light-sensing elements RSE-2 disposed in the second sub-area 114B-2 of the second reference area 114B may be determined according to actual needs. When there is a greater number of rows of the second reference light-sensing elements RSE-2, the correction effect may be better. In an embodiment not shown, the number of rows of the second reference light-sensing element RSE-2 disposed in the second sub-area 114B-2 of the second reference area 114B may be 3 or more rows. However, the disclosure is not limited thereto. In another embodiment not shown, the number of rows of the second reference light-sensing elements RSE-2 disposed in the second sub-area 114B-2 of the second reference area 114B may also be 1 row, and the interpolation method may be used to compensate for the deficiency thereof.

In the embodiment, the substrate 110 has a first edge 110a and a second edge 110b opposite to each other. The first processing element IC1, the second processing element IC2, and the third processing element IC3 are disposed closer to the second edge 110b, and the first edge 110a is farther away from the first processing element IC1, the second processing element IC2, and the third processing element IC3. In the embodiment, the second reference area 114B further includes a third sub-area 114B-3 and a fourth sub-area 114B-4. The third portion of the multiple second reference light-sensing elements RSE-2 is disposed in the third sub-area 114B-3 of the second reference area 114B. The third sub-area 114B-3 of the second reference area 114B is located between the first edge 110a of the substrate 110 and the second working area 112B and between the first sub-area 114B-1 and the second sub-area 114B-2 of the second reference area 114B. The fourth portion of the multiple second reference light-sensing elements RSE-2 is disposed in the fourth sub-area 114B-4 of the second reference area 114B. The fourth sub-area 114B-4 of the second reference area 114B is located between the second edge 110b of the substrate 110 and the second working area 112B and between the first sub-area 114B-1 and the second sub-area 114B-2 of the second reference area 114B.

In short, in the embodiment, the second reference area 114B includes the first sub-area 114B-1, the second sub-area 114B-2, the third sub-area 114B-3, and the fourth sub-area 114B-4. The first sub-area 114B-1, the second sub-area 114B-2, the third sub-area 114B-3, and the fourth sub-area 114B-4 of the second reference area 114B form a frame-shaped area which surrounds the second working area 112B and is located between the first working area 112A and the third working area 112C.

In the embodiment, the first reference area 114A may be a U-shaped area disposed on the upper, lower, and left sides of the first working area 112A; the third reference area 114C may be another U-shaped area disposed on the upper, lower, and right sides of the third working area 112C, but the disclosure is not limited thereto.

In the embodiment, the light-sensing device 10E further includes at least one first conductive line CL1, at least one first connecting line BL1, at least one second conductive line CL2, at least one second connecting line BL2, at least one third conductive line CL3, and at least one third connecting line BL3. The at least one first conductive line CL1 is electrically connected to the multiple first working light-sensing elements WSE-1 and the first processing element IC1. The at least one first connecting line BL1 is electrically connected to at least a part of the multiple first reference light-sensing elements RSE-1 and the first processing element IC1. The at least one second conductive line CL2 is electrically connected to the multiple second working light-sensing elements WSE-2 and the second processing element IC2. The at least one second connecting line BL2 is electrically connected to at least a part of the multiple second reference light-sensing elements RSE-2 and the second processing element IC2. The at least one third conductive line CL3 is electrically connected to the multiple third working light-sensing elements WSE-3 and the third processing element IC3. The at least one third connecting line BL3 is electrically connected to at least a part of the multiple third reference light-sensing elements RSE-3 and the third processing element IC3.

Figure 17:
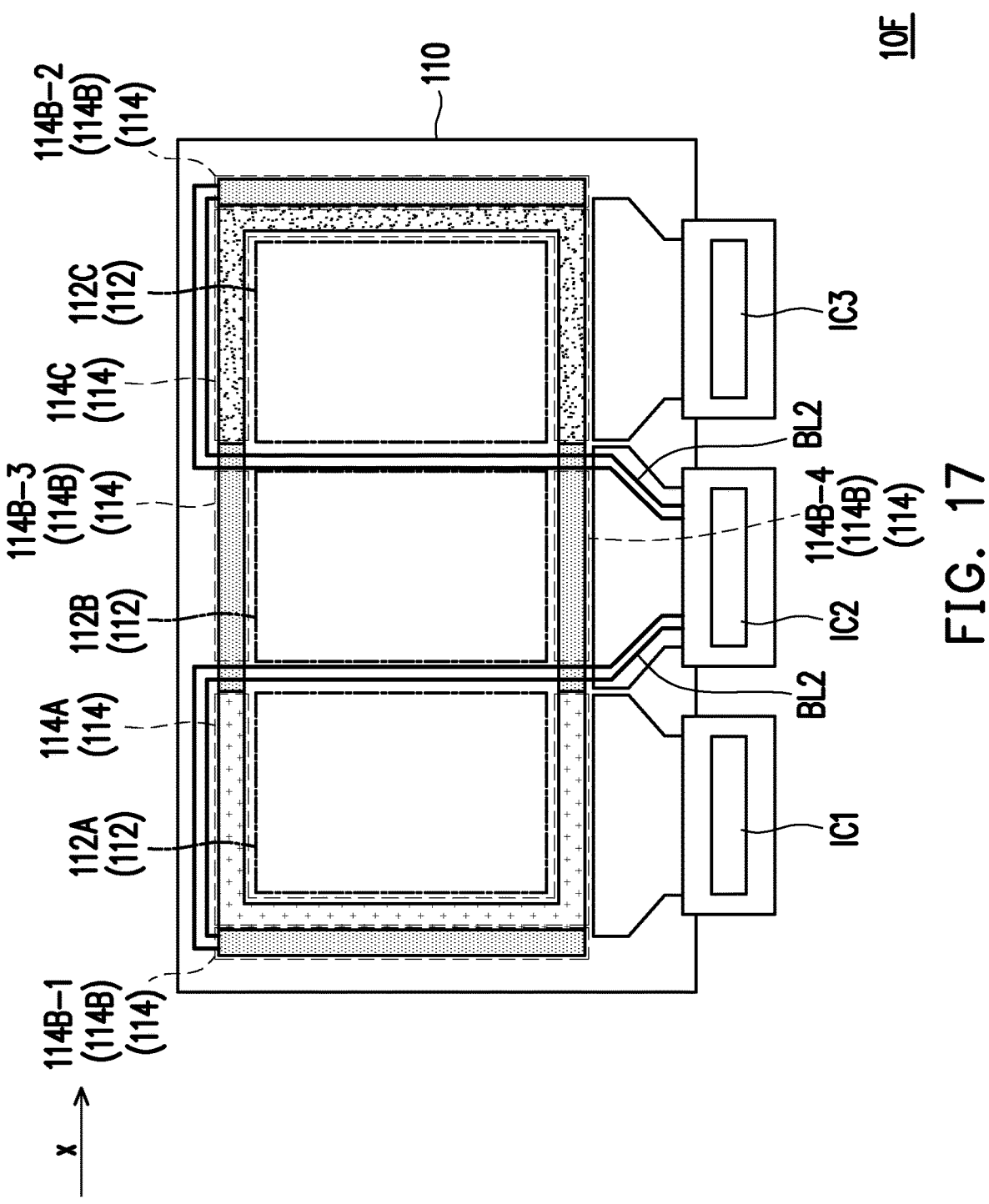
FIG. 17 is a schematic diagram of a light-sensing device according to another embodiment of the disclosure.
Figure 18:
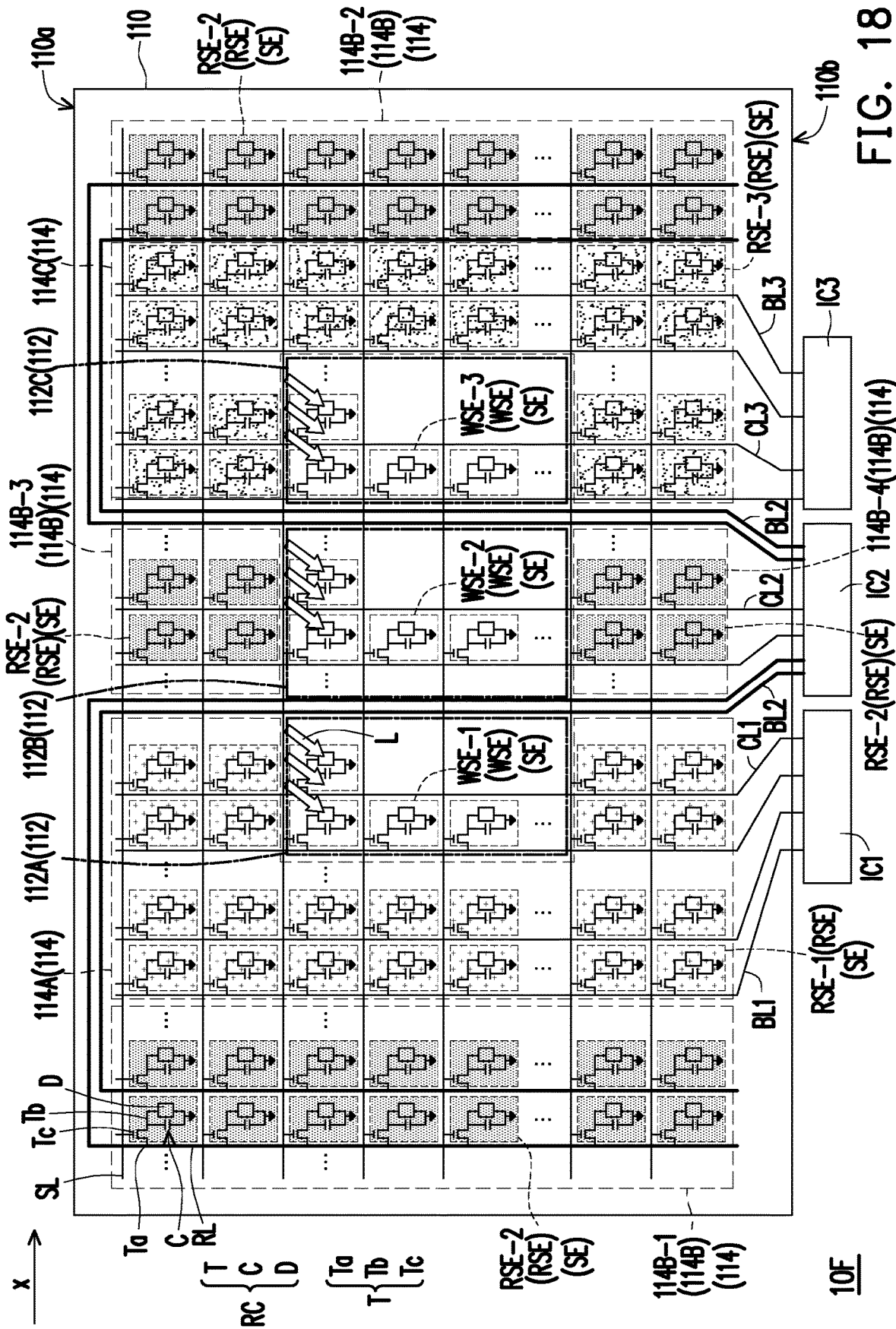
FIG. 18 is a schematic diagram of a light-sensing device according to another embodiment of the disclosure.

FIG. 17 is a schematic diagram of a light-sensing device according to another embodiment of the disclosure. FIG. 18 is a schematic diagram of a light-sensing device according to another embodiment of the disclosure. FIG. 17 shows the first working area 112A, the second working area 112B, the third working area 112C, the first reference area 114A, the second reference area 114B, the third reference area 114C, the first processing element IC1, the second processing element IC2, the third processing element IC3, and the second connecting line BL2 of the substrate 110 of FIG. 10, while other components are omitted.

A light-sensing device 1OF of FIG. 17 and FIG. 18 is similar to the light-sensing device 10E of FIG. 15 and FIG.

16, and the difference between the two is that the positions of the first sub-area 114B-1 and the second sub-area 114B-2 of the second reference area 114B are different.

Please refer to FIG. 17 and FIG. 18. Specifically, in the embodiment, the first working area 112A is located between the first sub-area 114B-1 of the second reference area 114B and the second working area 112B, and a part of the first reference area 114A is located between the first sub-area 114B-1 of the second reference area 114B and the first working area 112A. In short, in the embodiment, all the light-sensing elements SE form a light-sensing array, and the first sub-area 114B-1 of the second reference area 114B may be the leftmost area of the light-sensing array.

In the embodiment, the third working area 112C is located between the second sub-area 114B-2 of the second reference area 114B and the second working area 112B, and part of the third reference area 114C is located between the second sub-area 114B-2 of the second reference area 114B and the third working area 112C. In short, in the embodiment, all the light-sensing elements SE form a light-sensing array, and the second sub-area 114B-2 of the second reference area 114B may be the rightmost area of the light-sensing array.

By disposing the first sub-area 114B-1 of the second reference area 114B and the second working area 112B in the outer area of the light-sensing array, the first working area 112A, the second working area 112B, and the third working area 112C may form a relatively continuous working area 112 and further enhance the visual effect of the light-sensing device 10F.

The second connecting line BL2 is electrically connected to at least a part of the multiple second reference light-sensing elements RSE-2 and the second processing element IC2. In the embodiment, the second connecting line BL2 electrically connected to the second reference light-sensing element RSE-2 located in the first sub-area 114B-1 (for example, a second connecting line BL2 on the further left side in FIG. 18) may be disposed between the first working area 112A and the second working area 112B; the second connecting line BL2 electrically connected to the second reference light-sensing element RSE-2 located in the second sub-area 114B-2 (for example, another second connecting line BL2 on the further right side in FIG. 18) may be disposed between the second working area 112B and the third working area 112C. In the embodiment, multiple second connecting lines BL2 electrically connected to the second reference light-sensing element RSE-2 located in the first sub-area 114B-1 and the second sub-area 114B-2 may also be disposed between the light-sensing array formed by the multiple light-sensing elements SE and the first edge 110a of the substrate 110.

Figure 19:
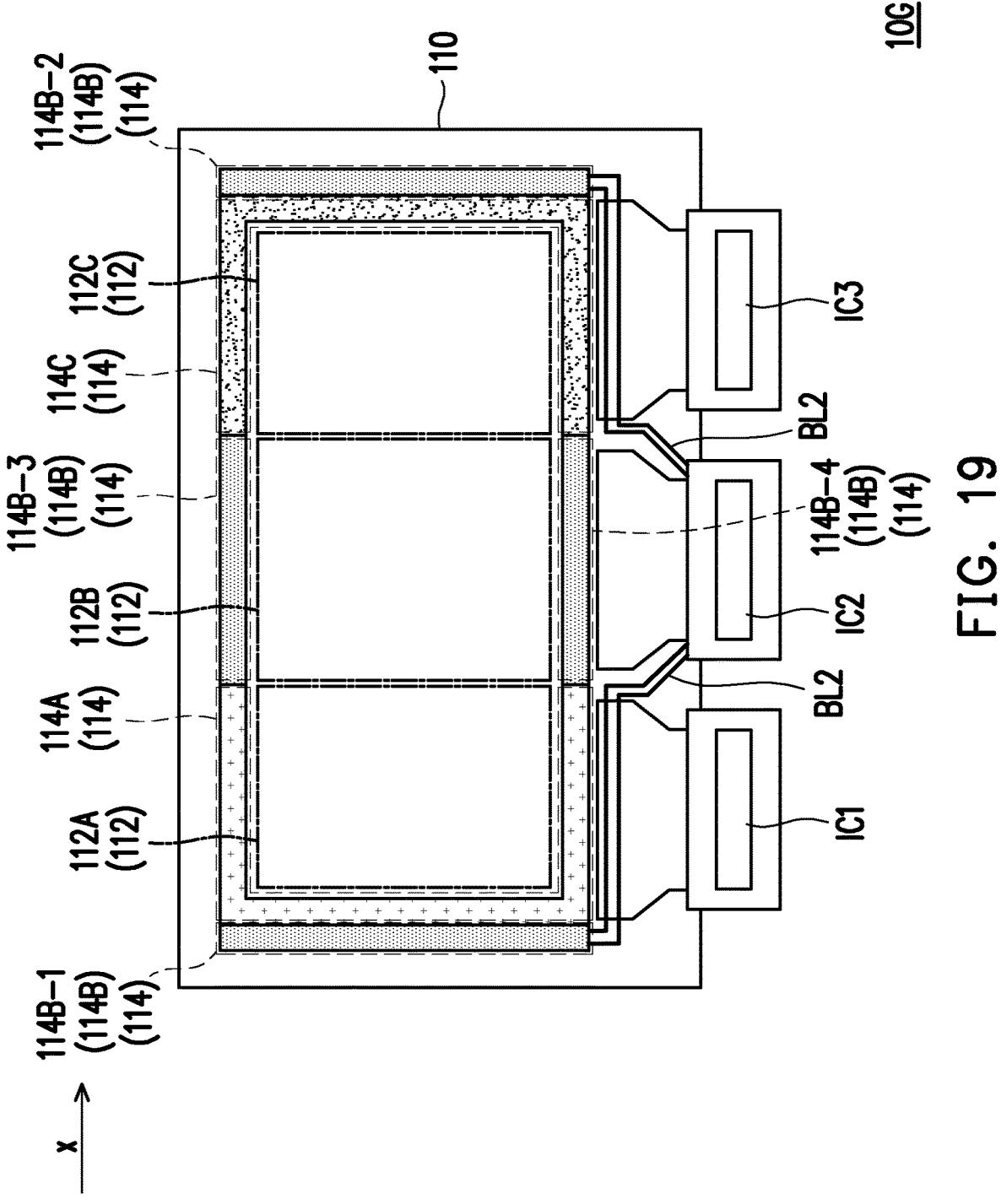
FIG. 19 is a schematic diagram of a light-sensing device according to yet another embodiment of the disclosure.
Figure 20:
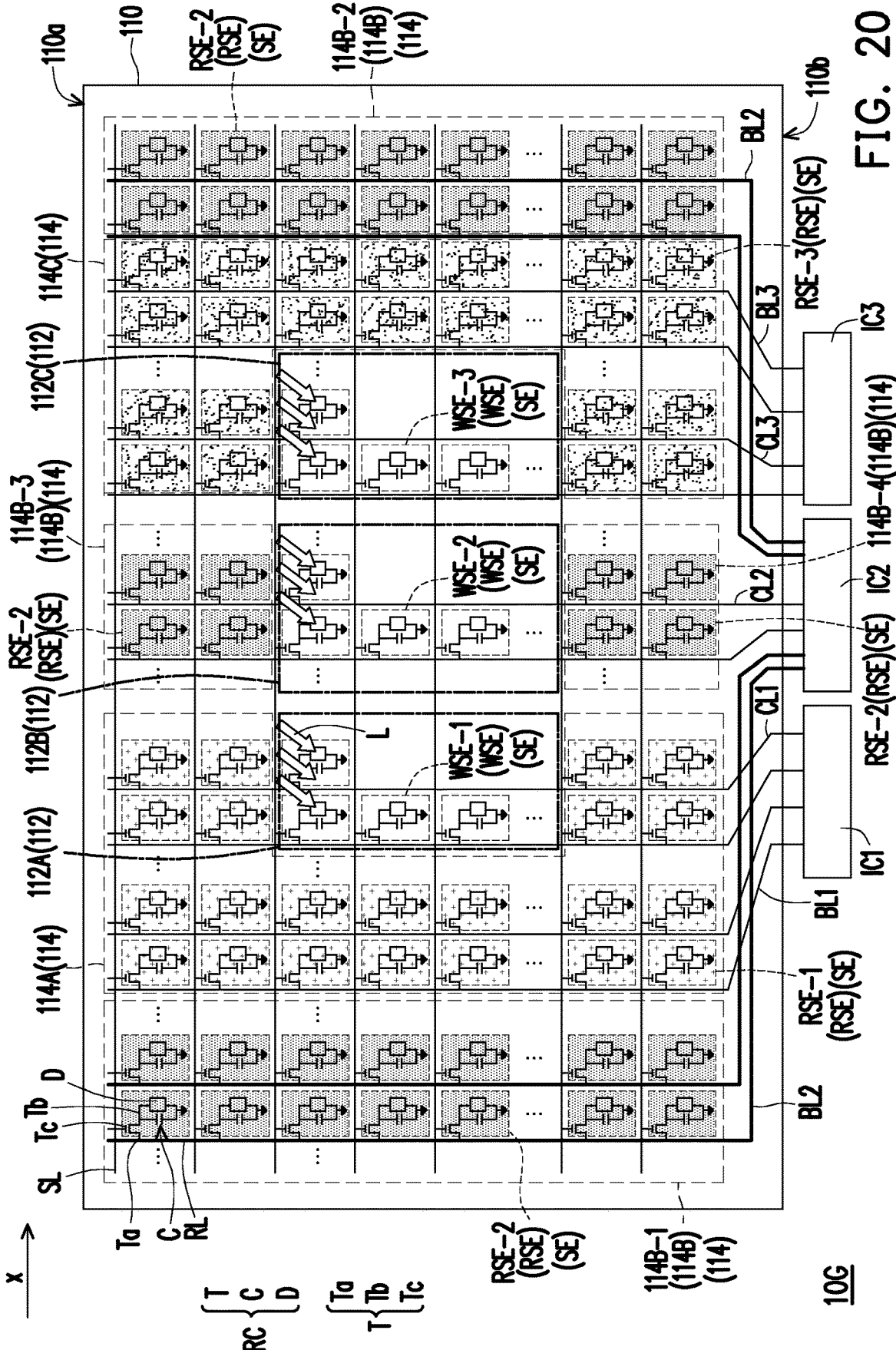
FIG. 20 is a schematic diagram of a light-sensing device according to yet another embodiment of the disclosure.

FIG. 19 is a schematic diagram of a light-sensing device according to yet another embodiment of the disclosure. FIG. 20 is a schematic diagram of a light-sensing device according to yet another embodiment of the disclosure. FIG. 19 shows the first working area 112A, the second working area 112B, the third working area 112C, the first reference area 114A, the second reference area 114B, the third reference area 114C, the first processing element IC1, the second processing element IC2, the third processing element IC3, and the second connecting line BL2 of the substrate 110 of FIG. 20, while other components are omitted.

A light-sensing device 10G of FIG. 19 and FIG. 20 is similar to the light-sensing device 10F of FIG. 17 and FIG. 18. The difference between the two is that the position of the second connecting line BL2 is different. Please refer to FIG. 19 and FIG. 20. Specifically, in the embodiment, the first conductive line CL1 electrically connected to the first working light-sensing element WSE-1 located in the first working area 112A and the second connecting line BL2 electrically connected to the second connecting line BL2 electrically connected to the second reference light-sensing element RSE-2 located in the first sub-area 114B-1 (for example, the second connecting line BL2 on the further left side of FIG. 20) may be across each other. The first conductive line CL1 and the second connecting line BL2 respectively belong to different conductive layers.

The third conductive line CL3 electrically connected to the third working light-sensing element WSE-3 located in the third working area 112C and the second connecting line BL2 electrically connected to the second reference light-sensing element RSE-2 located in the second sub-area 114B-2 (for example, the second connecting line BL2 on the further right side of FIG. 20) may be across each other. The third conductive line CL3 and the second connecting line BL2 respectively belong to different conductive layers.

Figure 21:
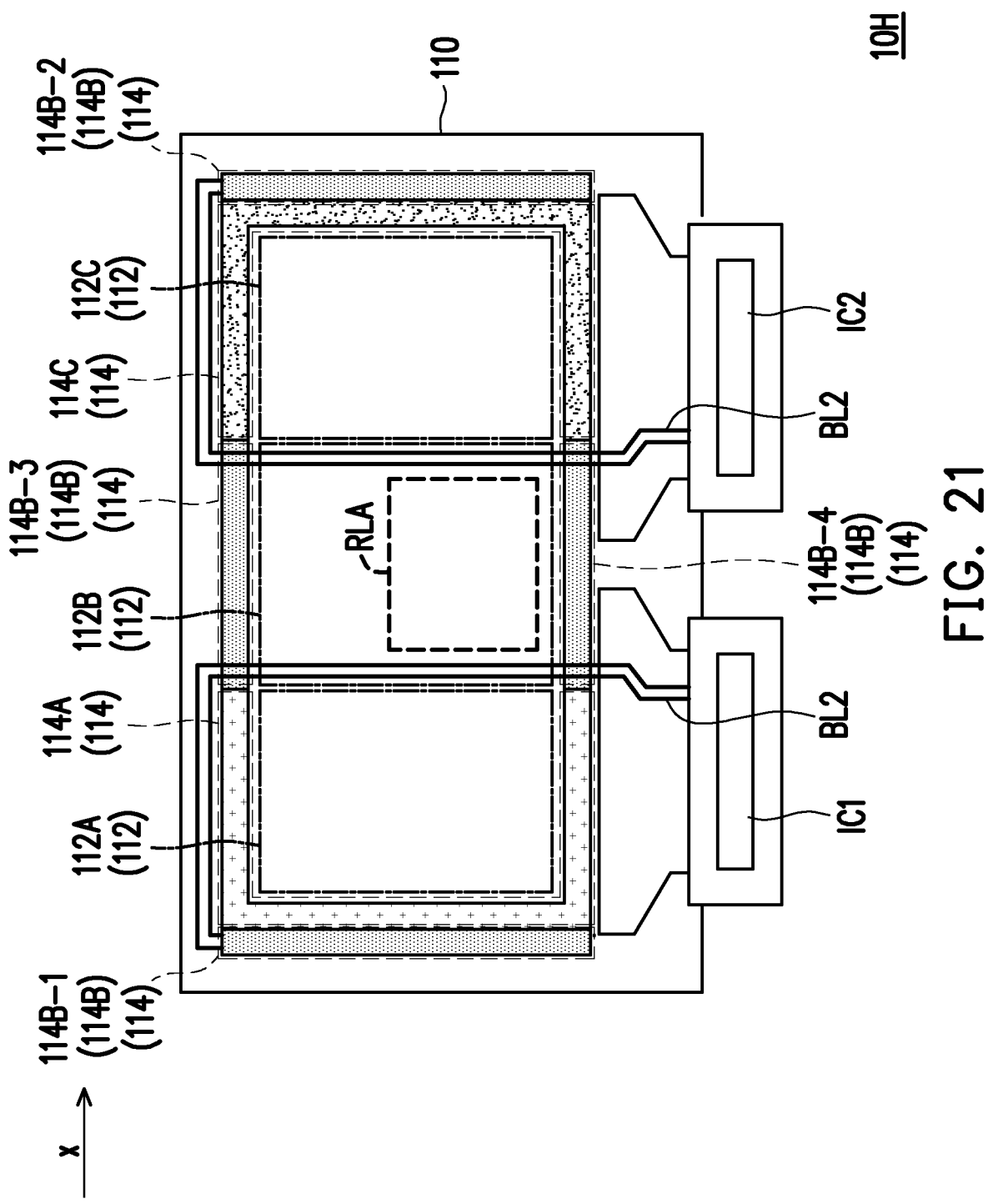
FIG. 21 is a schematic diagram of a light-sensing device according to still another embodiment of the disclosure.
Figure 22:
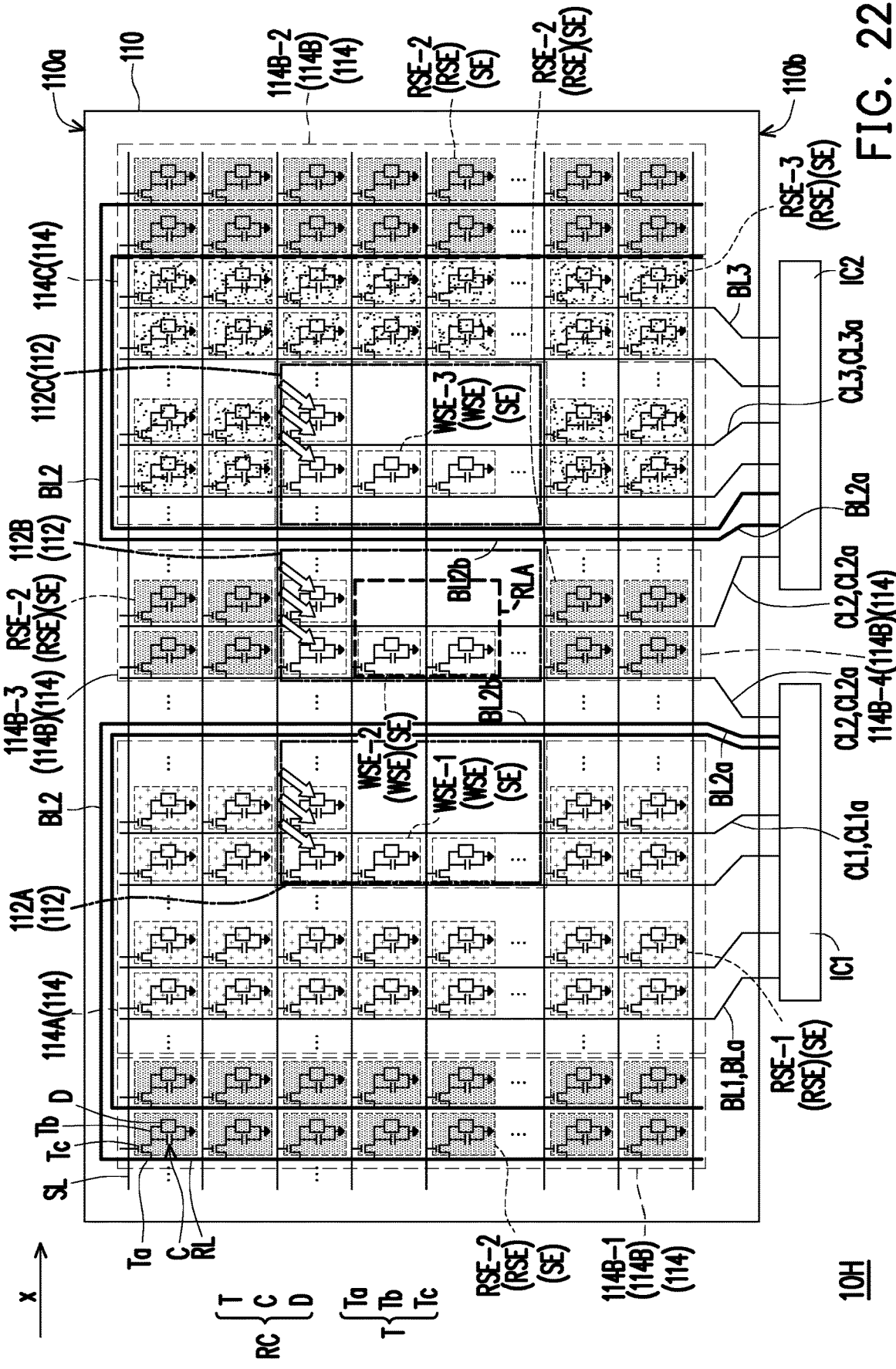
FIG. 22 is a schematic diagram of a light-sensing device according to still another embodiment of the disclosure.

FIG. 21 is a schematic diagram of a light-sensing device according to still another embodiment of the disclosure. FIG. 22 is a schematic diagram of a light-sensing device according to still another embodiment of the disclosure. FIG. 21 shows the first working area 112A, the second working area 112B, the third working area 112C, the first reference area 114A, the second reference area 114B, the third reference area 114C, the first processing element IC1, the second processing element IC2, and the second connecting line BL2 of the substrate 110 of FIG. 22, while other components are omitted.

The light-sensing device 10G of FIG. 21 and FIG. 22 is similar to the light-sensing device 10F of FIG. 17 and FIG. 18. The difference between the two are as follows.

Please refer to FIG. 21 and FIG. 22. In the embodiment, the multiple first working light-sensing elements WSE-1 are electrically connected to the first processing element IC1, the multiple third working light-sensing elements WSE-3 are electrically connected to the second processing element IC2, the first portion of the multiple second working light-sensing elements WSE-2 is electrically connected to the first processing element IC1, and the second portion of the multiple second working light-sensing elements WSE-2 is electrically connected to the second processing element IC2.

The first portion of the at least one second conductive line CL2 (for example, a second conductive line CL2 on the further left side of FIG. 22) is electrically connected to the first portion of the multiple second working light-sensing elements WSE-2 and the first processing element IC1. The second portion of the at least one second conductive line CL2 (for example, a second conductive line CL2 on the further right side of FIG. 22) is electrically connected to the second portion of the multiple second working light-sensing elements WSE-2 and the second processing element IC2. The first portion of the at least one second connecting line BL2 (for example, a second connecting line BL2 on the further left side of FIG. 22) is electrically connected to the first portion of the multiple second reference light-sensing elements RSE-2 located in the first sub-area 114B-1 and the first processing element IC1. The at least one third conductive line CL3 is electrically connected to the multiple third working light-sensing elements WSE-3 and the second processing element IC2. The at least one third connecting line BL3 is electrically connected to at least a part of the multiple third reference light-sensing elements RSE-3 and the second processing element IC2.

It should be noted that the first portion of the at least one second connecting line BL2 (for example, a second connecting line BL2 on the further left side of FIG. 22) has at least one connecting terminal BL2a connected to the first processing element IC1. The multiple first conductive lines CL1 have multiple connecting terminals CL1a connected to the first processing element IC1. The first portion of the multiple second conductive lines CL2 (for example, a second conductive line CL2 on the further left side of FIG. 22) has at least one connecting terminal CL2a connected to the first processing element IC1. The at least one connecting terminal BL2a of the first portion of the at least one second connecting line BL2 is disposed between the multiple connecting terminals CL1a of the multiple first conductive lines CL1 and the at least one connecting terminal CL2a of the first portion of the multiple second conductive lines CL2.

The second portion of the multiple second conductive lines CL2 (for example, a second conductive line CL2 on the further right side of FIG. 22) is electrically connected to the second processing element IC2. The second portion of the multiple second conductive lines CL2 has the at least one connecting terminal CL2a connected to the second processing element IC2. The multiple third conductive lines CL3 have multiple connecting terminals CL3a connected to the second processing element IC2. The second portion of the multiple second reference light-sensing elements RSE-2 is disposed in the second sub-area 114B-2 of the second reference area 114B. The third working area 112C is located between the second working area 112B and the second sub-area 114B-2 of the second reference area 114B. The second portion of the at least one second connecting line BL2 (for example, another second connecting line BL2 on the further right side of FIG. 22) is electrically connected to the second portion of the multiple second reference light-sensing elements RSE-2 and the second processing element IC2, and has the at least one connecting terminal BL2a connected to the second processing element IC2. The at least one connecting terminal BL2a of the second portion of the at least one second connecting line BL2 is disposed between the at least one connecting terminal CL2a of the second portion of the multiple second conductive lines CL2 and the multiple connecting terminals CL3a of the multiple third conductive lines CL3a.

The first portion of the at least one second connecting line BL2 (for example, a second connecting line BL2 on the further left side of FIG. 22) has at least one main segment BL2b. The at least one main segment BL2b of the first portion of the at least one second connecting line BL2 is connected to the first portion of the multiple second reference light-sensing elements RSE-2 and the at least one connecting terminal BL2a of the first portion of the at least one second connecting line BL2, and the at least one main segment BL2b of the at least one second connecting line BL2 is disposed on the second between the first working area 112A and the second working area 112B. The second portion of the at least one second connecting line BL2 (for example, another second connecting line BL2 on the further right side of FIG. 22) has the at least one main segment BL2b. The at least one main segment BL2b of the second portion of the at least one second connecting line BL2 is connected to the second portion of the multiple second reference light-sensing elements RSE-2 located in the second sub-area 114B-2 and the at least one connecting terminal BL2a of the second portion of the at least one second connecting line BL2, and the at least one main segment BL2b of the second portion of the at least one second connecting line BL2 is disposed between the second working area 112B and the third working area 112C.

A sensing device 10H of the embodiment may operate in a partial rolling sensing mode. The partial rolling sensing mode is to reduce the sensing area and increase the number of sensing frames and is mainly for the purpose of the fingerprint rolling and pressing collection. In the partial rolling sensing mode, due to the size limitation of the scrolling sub-area RLA, the first processing element IC1 and the second processing element IC2 only need to read the sensing signals of the second connecting line BL2 and the second conductive line CL2 corresponding to the rolling sub-area RLA of the working area 112, whereas the first processing element IC1 and the second processing element IC2 do not need to read the sensing signals of the first conductive line CL1, the first connecting line BL1, the third conductive line CL3, and the third connecting line BL3.

In the embodiment, the multiple connecting terminals CL1a of the multiple first conductive lines CL1, the at least one connecting terminal BL2a of the first portion of the at least one second connecting line BL2 (for example, a second connecting line BL2 on the further left side of FIG. 22), and the at least one connecting terminal CL2a of the first portion of the multiple second conductive lines CL2 (for example, a second conductive line CL2 on the further left side of FIG. 22) are sequentially electrically connected to the multiple pins (not shown) of the first processing element IC1. The at least one connecting terminal CL2a of the second portion of the multiple second conductive lines CL2 (for example, a second conductive line CL2 on the further right side of FIG. 22), the at least one connecting terminal BL2a of the second portion of the at least one second connecting line BL2 (for example, another second conductive line CL2 on the further right side of FIG. 22), and the multiple connecting terminals CL3a of the multiple third conductive lines CL3a are sequentially electrically connected to the multiple pins (not shown) of the second processing element IC2. Therefore, even if the first processing element IC1 and the second processing element IC2 do not support the discontinuous reading mode, a light-sensing device 10H may still operate smoothly in the partial rolling sensing mode.

What is claimed is:

1. A light-sensing device, comprising:
   a substrate, having a working area and a reference area outside the working area; and
   a plurality of light-sensing elements, wherein each light-sensing element comprises a reading circuit, a first electrode electrically connected to the reading circuit, a light-sensing pattern disposed on the first electrode, a second electrode disposed on the light-sensing pattern, and a first light-blocking structure disposed on the second electrode;
   the light-sensing elements comprise a plurality of working light-sensing elements and a plurality of reference light-sensing elements, wherein the working light-sens-ing elements are disposed in the working area of the substrate, and the reference light-sensing elements are disposed in the reference area of the substrate;
   the first light-blocking structure of each working light-sensing element has a light-transmitting opening over-lapping the light-sensing pattern of the working light-sensing element;
   the first light-blocking structure of each reference light-sensing element shields the light-sensing pattern of the reference light-sensing element;
   each reference light-sensing element further comprises a second light-blocking structure, wherein the first light-blocking structure and the second light-blocking struc-ture of each reference light-sensing elements are respectively disposed on upper and lower sides of the light-sensing pattern of the reference light-sensing ele-ment, and a vertical projection of the light-sensing pattern of the reference light-sensing element on the substrate falls within a vertical projection of the second light-blocking structure of the reference light-sensing element on the substrate.

2. The light-sensing device according to claim 1, wherein the second light-blocking structure of the reference light-sensing element is disposed between a semiconductor pat-tern of the reference light-sensing element and the substrate, and the second light-blocking structure of the reference light-sensing element overlaps the semiconductor pattern of the reference light-sensing element and the light-sensing pattern of the reference light-sensing element in a direction perpendicular to the substrate.

3. The light-sensing device according to claim 1, wherein the second light-blocking structure of each reference light-sensing element comprises:
   a bottom light-shielding pattern, disposed on the sub-strate; and
   a first conductive pattern, disposed above the bottom light-shielding pattern, wherein the bottom light-shielding pattern has an opening, and the first conduc-tive pattern covers the opening of the bottom light-shielding pattern.

4. The light-sensing device according to claim 3, wherein an edge of the first conductive pattern and an edge of the opening of the bottom light-shielding pattern are substan-tially aligned.

5. The light-sensing device according to claim 3, wherein each light-sensing element further comprises:
   a shielding layer, disposed on the first light-blocking structure of the light-sensing element, wherein the first light-blocking structure is disposed between the shield-ing layer and the light-sensing pattern, and the shield-ing layer has an opening overlapping the light-sensing pattern;
   the opening of the shielding layer of each reference light-sensing element and the second light-blocking structure of the reference light-sensing element are overlapped.

6. The light-sensing device according to claim 5, wherein the opening of the bottom light-shielding pattern of each reference light-sensing element and the opening of the shielding layer of the reference light-sensing element are overlapped.

7. The light-sensing device according to claim 1, wherein each light-sensing element further comprises:
   a shielding layer, disposed on the first light-blocking structure of the light-sensing element, wherein the first light-blocking structure is disposed between a shielding layer and the light-sensing pattern of the light-sensing element, and the shielding layer has an opening over-lapping the light-sensing pattern of the light-sensing element;
   the opening of the shielding layer of each reference light-sensing element and the second light-blocking structure of the reference light-sensing element are overlapped.

8. The light-sensing device according to claim 1, wherein each light-sensing element further comprises:
   a passivation layer, disposed on the light-sensing pattern of the light-sensing element, and having a contact window, wherein the second electrode of each light-sensing element is electrically connected to the light-sensing pattern through the contact window of the passivation layer;
   the passivation layer of one of the reference light-sensing elements further has a groove, the groove is located beside the light-sensing pattern of the one of the reference light-sensing elements, and the first light-blocking structure of the one of the reference light-sensing elements is filled into the groove.

9. The light-sensing device according to claim 8, wherein the groove surrounds the light-sensing pattern of the one of the reference light-sensing elements.

10. The light-sensing device according to claim 8, wherein the groove is disposed beside a single side of the light-sensing pattern of the one of the reference light-sensing elements.

* * * * *